(12) United States Patent
Mos et al.

(10) Patent No.: US 9,971,478 B2
(45) Date of Patent: May 15, 2018

(54) METHOD AND APPARATUS FOR INSPECTION AND METROLOGY

(71) Applicant: ASML NETHERLANDS B.V., Veldhoven (NL)

(72) Inventors: Everhardus Cornelis Mos, Best (NL); Erik Mathijs Maria Crombag, Eindhoven (NL); Ajith Ganesan, Waalre (NL)

(73) Assignee: ASML NETHERLANDS B.V., Veldhoven (NL)

( * ) Notice: Subject to any disclaimer, the term of this patent is extended or adjusted under 35 U.S.C. 154(b) by 75 days.

(21) Appl. No.: 15/093,523

(22) Filed: Apr. 7, 2016

(65) Prior Publication Data

US 2016/0299438 A1    Oct. 13, 2016

Related U.S. Application Data

(60) Provisional application No. 62/146,098, filed on Apr. 10, 2015.

(51) Int. Cl.
   *G03B 27/42*      (2006.01)
   *G06F 3/0482*     (2013.01)
   *G03F 7/20*       (2006.01)

(52) U.S. Cl.
   CPC ........ *G06F 3/0482* (2013.01); *G03F 7/70508* (2013.01); *G03F 7/70616* (2013.01)

(58) Field of Classification Search
   CPC .............. G06F 3/0482; G06F 3/04847; G06F 3/04842; G06F 3/04883; G06F 3/017; G06F 3/0488; G06F 3/041; G06F 17/30554; G06F 19/3406; G06F 3/04815; G06F 3/0484; G06F 3/1423; G06F 3/04812; G06F 3/147; G06F 9/543; G06F 17/30038; G06F 17/3005
   See application file for complete search history.

(56) References Cited

U.S. PATENT DOCUMENTS

| | | |
|---|---|---|
| 2004/0102934 A1 | 5/2004 | Chang |
| 2005/0047645 A1 | 3/2005 | Funk et al. |
| 2005/0071773 A1 | 3/2005 | Ivanovic et al. |
| 2005/0187649 A1 | 8/2005 | Funk et al. |
| 2013/0326439 A1* | 12/2013 | Matsuoka .............. G01B 15/04 716/55 |
| 2015/0039266 A1 | 2/2015 | Axness et al. |

* cited by examiner

*Primary Examiner* — Mesfin Asfaw
(74) *Attorney, Agent, or Firm* — Pillsbury Winthrop Shaw Pittman LLP

(57) ABSTRACT

A method of displaying a plurality of graphical user interface elements, each graphical user interface element representing a step in a measurement design, setup and/or monitoring process and each graphical user interface element enabling access by the user to further steps in the measurement design, setup and/or monitoring process for the associated step of the graphical user interface element, and displaying an indicator associated with one or more of the plurality of graphical user elements, the indicator indicating that a step in the measurement design, setup and/or monitoring process is not completed and/or that a key performance indicator associated with a step in the measurement design, setup and/or monitoring process has passed a threshold.

20 Claims, 10 Drawing Sheets

METHOD AND APPARATUS FOR INSPECTION AND METROLOGY

The present application claims the benefit of priority of U.S. Provisional Application No. 62/146,098, which was filed on Apr. 10, 2015, and is incorporated herein in its entirety by reference.

FIELD

The present description relates to a method and apparatus for correction of error in measured radiation distribution captured from a metrology target.

BACKGROUND

A lithographic apparatus is a machine that applies a desired pattern onto a substrate, usually onto a target portion of the substrate. A lithographic apparatus can be used, for example, in the manufacture of integrated circuits (ICs) or other devices. In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

SUMMARY

Manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography (which typically involves transferring a pattern to a radiation-sensitive resist arranged on the substrate), etch, chemical-mechanical polishing, and ion implantation. Multiple devices may be fabricated on a plurality of dies on a substrate and then separated into individual devices.

Metrology processes are used at various steps during a device manufacturing process to monitor and control the process. For example, metrology processes are used to measure one or more characteristics of a substrate, such as a relative location (e.g., overlay, alignment, etc.) or dimension (e.g., line width, critical dimension, thickness, etc.) of features formed on the substrate during a process, such that the performance of the process can be determined from the one or more characteristics. If the one or more characteristics are unacceptable (e.g., out of a predetermined range for the characteristic(s)), the measurements of the one or more characteristics may be used to alter one or more parameters of the process such that further substrates manufactured by the process have an acceptable characteristic(s).

So, significant aspects to enabling a device manufacturing process include developing the process itself, setting it up for monitoring and control and then actually monitoring and controlling the process itself. Assuming a configuration of the fundamentals of the device manufacturing process (such as the patterning device pattern(s), the resist type(s), the post-lithography process steps (such as the development, etch, etc.), etc.), it is desirable to setup the lithographic apparatus for transferring the pattern onto the substrates, develop the metrology targets to monitor the process, setup up the metrology processes to measure the metrology targets and then implement a process of monitoring and controlling the process based on measurements In an aspect, there is provided a method comprising: performing a simulation to evaluate a plurality of metrology targets and/or a plurality of metrology recipes used to measure a metrology target; identifying one or more metrology targets and/or metrology recipes from the evaluated plurality of metrology targets and/or metrology recipes; receiving measurement data of the one or more identified metrology targets and/or metrology recipes; and using the measurement data to tune a metrology target parameter or metrology recipe parameter, of the simulation.

In an aspect, there is provided a method comprising: receiving measurement data of a plurality of different metrology targets, each measured at a plurality of metrology recipes; and using the measurement data to verify one or more parameters of a simulation used to evaluate a plurality of metrology targets and/or a plurality of metrology recipes used to measure a metrology target.

In an aspect, there is provided a method comprising: simulating a plurality of metrology targets and/or a plurality of metrology recipes taking an expected process condition into account; identifying one or more metrology targets and/or recipes from the simulated plurality of metrology targets and/or recipes; receiving measurement data of the one or more identified metrology targets and/or recipes; and using the measurement data to verify the expected process condition.

In an aspect, there is provided a method comprising: performing a simulation to evaluate a plurality of metrology targets and/or a plurality of metrology recipes used to measure a metrology target and determining a parameter representing performance of one or more of the metrology targets and/or metrology recipes; identifying one or more metrology targets and/or metrology recipes from the evaluated plurality of metrology targets and/or metrology recipes; receiving measurement data of the one or more identified metrology targets and/or metrology recipes; and selecting, based on the measurement data and the parameter, one or more metrology targets and/or metrology recipes from the identified one or more metrology targets and/or metrology recipes.

In an aspect, there is provided a method comprising: performing a simulation to evaluate a plurality of metrology targets and a plurality of metrology recipes used to measure a metrology target; identifying one or more combinations of metrology target and metrology recipe from the evaluated plurality of metrology targets and metrology recipes; formulating a plurality of metrology recipes for the one or more metrology targets from the identified one or more combinations based on the one or more metrology recipes from the identified one or more combinations; and receiving measurement data of the one or more metrology targets from the identified one or more combinations measured using the formulated plurality of metrology recipes.

In an aspect, there is provided a method comprising: determining a parameter representative of sensitivity of one or more metrology recipes, or one or more metrology recipe parameters, to one or more metrology targets based on measurement data of a metrology target measured at a plurality of metrology recipes; and evaluating, based on the parameter representative of sensitivity, a plurality of metrology recipes used to measure the metrology target by simulation or against measured data to identify one or more metrology recipes of the plurality of metrology recipes for use in measuring the metrology target.

In an aspect, there is provided a method comprising: evaluating a plurality of metrology targets and/or a plurality of metrology recipes used to measure a metrology target by simulation or against measured data; and identifying one or more metrology targets and/or metrology recipes from the evaluated plurality of metrology targets and/or metrology recipes for which diffraction efficiency, or a parameter derived from diffraction efficiency, crosses a threshold.

In an aspect, there is provided a method comprising: evaluating a plurality of metrology targets and/or a plurality of metrology recipes used to measure a metrology target by simulation or against measured data; and identifying one or more metrology targets and/or metrology recipes from the evaluated plurality of metrology targets and/or metrology recipes for which a measurement apparatus property, or a parameter derived from the measurement apparatus property, crosses a threshold.

In an aspect, there is provided a method comprising: evaluating, with respect to a parameter representing remaining uncertainty of a mathematical model fitting measured data, one or more mathematical models for fitting measured data and one or more measurement sampling schemes for measuring data, against measurement data across a substrate; and identifying one or more mathematical models and/or one or more measurement sampling schemes for which the parameter crosses a threshold.

In an aspect, there is provided a method comprising: evaluating, with respect to a first evaluation parameter and a second different evaluation parameter, one or more mathematical models for fitting measured data and one or more measurement sampling schemes for measuring data, against measurement data across a substrate; and identifying one or more mathematical models and/or one or more measurement sampling schemes for which the first and second evaluation parameters cross a threshold.

In an aspect, there is provided a method of determining a sampling scheme for measuring data and/or a mathematical model for fitting measured data, to monitor a process step in a lithographic process, the method comprising: determining the sampling scheme and the mathematical model at least partially based on a through-put model of an inspection apparatus.

In an aspect, there is provided a method comprising: receiving measurement data of a metrology target measured according to a metrology recipe; determining a sampling scheme for measuring data with the metrology target using the metrology recipe at least partially based on a through-put model of an inspection apparatus; determining an evaluation parameter based on the measurement data and the sampling scheme; determining if the evaluation parameter crosses a threshold; and changing the sampling scheme at least partially based on the through-put model if the evaluation parameter is determined to cross the threshold.

In an aspect, there is provided a method comprising: displaying a plurality of graphical user interface elements, each graphical user interface element representing a step in a measurement design, setup and/or monitoring process and each graphical user interface element enabling access by the user to further steps in the measurement design, setup and/or monitoring process for the associated step of the graphical user interface element; and displaying an indicator associated with one or more of the plurality of graphical user elements, the indicator indicating that a step in the measurement design, setup and/or monitoring process is not completed and/or that a key performance indicator associated with a step in the measurement design, setup and/or monitoring process has passed a threshold.

In an aspect, there is provided a non-transitory computer program product comprising machine-readable instructions for causing a processor to cause performance of a method as described herein.

In an aspect, there is provided a system comprising: an inspection apparatus configured to provide a beam on a measurement target on a substrate and to detect radiation redirected by the target to determine a parameter of a lithographic process; and the non-transitory computer program product as described herein. In an embodiment, the system further comprises a lithographic apparatus comprising a support structure configured to hold a patterning device to modulate a radiation beam and a projection optical system arranged to project the modulated onto a radiation-sensitive substrate.

In an aspect, there is provided a system comprising: an alignment sensor, comprising: an output to provide radiation from a radiation source onto a target, a detector configured to receive radiation from the target, and a control system configured to determine alignment of two or more objects responsive to the received radiation; and the non-transitory computer program product as described herein. In an embodiment, the system further comprises a lithographic apparatus comprising a support structure configured to hold a patterning device to modulate a radiation beam and a projection optical system arranged to project the modulated onto a radiation-sensitive substrate.

In an aspect, there is provided a system comprising: a level sensor, comprising: an output to provide radiation from a radiation source onto a surface, a detector configured to receive radiation from the surface, and a control system configured to determine a position of the surface responsive to the received radiation; and the non-transitory computer program product as described herein. In an embodiment, the system further comprises a lithographic apparatus comprising a support structure configured to hold a patterning device to modulate a radiation beam and a projection optical system arranged to project the modulated onto a radiation-sensitive substrate.

In an aspect, there is provided a method of manufacturing devices wherein a device pattern is applied to a series of substrates using a lithographic process, the method comprising: inspecting a target as identified using a method as described herein and/or inspecting a target using a metrology recipe as identified using a method as described herein, the target formed as part of or beside the device pattern on at least one of the substrates; and controlling the lithographic process for later substrates in accordance with the result of the inspecting.

In an aspect, there is provided a method of manufacturing devices wherein a device pattern is applied to a series of substrates using a lithographic process, the method including inspecting at least a target formed as part of or beside the device pattern on at least one of the substrates using a sampling scheme as determined using a method as described herein, and controlling the lithographic process for the at least one substrate or another substrate in accordance with the result of the inspecting.

In an aspect, there is provided a method of manufacturing devices wherein a device pattern is applied to a series of substrates using a lithographic process, the method including inspecting at least a target formed as part of or beside the device pattern on at least one of the substrates, wherein the inspecting is performed using a sampling scheme as identified using a method as described herein and/or the measured data from the inspecting is modeled using a mathematical model as identified using a method as described herein, and controlling the lithographic process for the at least one substrate or another substrate in accordance with the result of the inspecting.

BRIEF DESCRIPTION OF THE DRAWINGS

Embodiments will now be described, by way of example only, with reference to the accompanying drawings in which.

DETAILED DESCRIPTION

Before describing embodiments in detail, it is instructive to present an example environment in which embodiments may be implemented.

Figure 1:
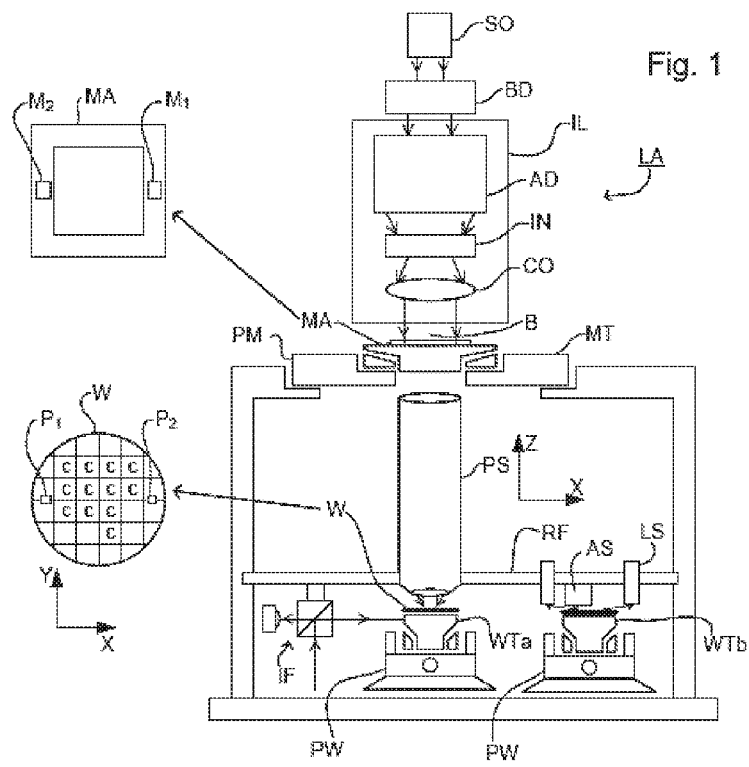
FIG. 1 schematically depicts an embodiment of a lithographic apparatus.

FIG. 1 schematically depicts a lithographic apparatus LA. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W, the projection system supported on a reference frame (RF).

The illumination system may include various types of optical components, such as refractive, reflective, magnetic, electromagnetic, electrostatic or other types of optical components, or any combination thereof, for directing, shaping, or controlling radiation.

The support structure supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
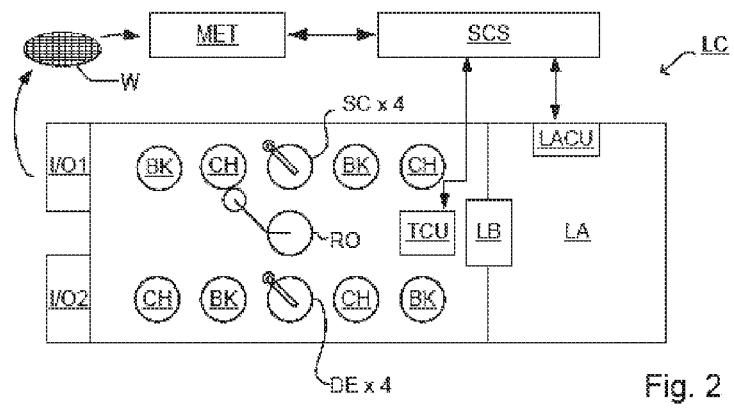
FIG. 2 schematically depicts an embodiment of a lithographic cell or cluster.

As shown in FIG. 2, the lithographic apparatus LA may form part of a lithographic cell LC, also sometimes referred to as a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently, it is desirable to inspect an exposed substrate to measure one or more properties such as overlay error between subsequent layers, line thickness, critical dimension (CD), focus offset, a material property, etc. Accordingly a manufacturing facility in which lithocell LC is located also typically includes a metrology system MET which receives some or all of the substrates W that have been processed in the lithocell. The metrology system MET may be part of the lithocell LC, for example it may be part of the lithographic apparatus LA.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, an inspection apparatus is used to determine one or more properties of the substrate, and in particular, how one or more properties of different substrates vary or different layers of the same substrate vary from layer to layer. The inspection apparatus may be integrated into the lithographic apparatus LA or the lithocell LC or may be a stand-alone device. To enable rapid measurement, it is desirable that the inspection apparatus measure one or more properties in the exposed resist layer immediately after the exposure. However, the latent image in the resist has a low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of a faulty substrate but may still provide useful information.

In order to monitor the device manufacturing process that includes at least one lithography step, the patterned substrate is inspected and one or more parameters of the patterned substrate are measured. The one or more parameters may include, for example, the overlay error between successive layers formed in or on the patterned substrate, critical linewidth (e.g., critical dimension (CD)) of developed photosensitive resist, focus or focus error of the lithography, dose or dose error of the lithography, aberrations of the lithography, etc. This measurement may be performed on a target of the product substrate itself and/or on a dedicated metrology target provided on the substrate. There are various techniques for making measurements of the structures formed in the device manufacturing process, including the use of a scanning electron microscope, image-based measurement or inspection tools and/or various specialized tools. A fast and non-invasive form of specialized metrology and/or inspection tool is one in which a beam of radiation is directed onto a target on the surface of the substrate and properties of the scattered (diffracted/reflected) beam are measured. By comparing one or more properties of the beam before and after it has been scattered by the substrate, one or more properties of the substrate can be determined. This may be termed diffraction-based metrology or inspection. A particular application of this diffraction-based metrology or inspection is in the measurement of feature asymmetry within a periodic target. This can be used as a measure of overlay error, for example, but other applications are also known. For example, asymmetry can be measured by comparing opposite parts of the diffraction spectrum (for example, comparing the −1st and +1$^{st}$ orders in the diffraction spectrum of a periodic grating). This can be done simply as is described, for example, in U.S. patent application publication US2006-066855, which is incorporated herein in its entirety by reference.

Significant aspects to enabling a device manufacturing process include developing the process itself, setting it up for monitoring and control and then actually monitoring and controlling the process itself. Assuming a configuration of the fundamentals of the device manufacturing process (such as the patterning device pattern(s), the resist type(s), the post-lithography process steps (such as the development, etch, etc.), etc.), it is desirable to setup the lithographic apparatus for transferring the pattern onto the substrates, develop the metrology targets to monitor the process, setup up the metrology processes to measure the metrology targets and then implement a process of monitoring and controlling the process based on measurements. While discussion in this application will consider an embodiment of a metrology target designed to measure overlay between one or more layers of a device being formed on a substrate, the embodiments herein are equally applicable to other metrology targets, such as targets to measure alignment (e.g., between a patterning device and a substrate), targets to measure critical dimension, etc. Accordingly, the references herein to overlay metrology targets, overlay data, etc. should be considered as suitably modified to enable other kinds of targets and metrology processes.

Figure 3:
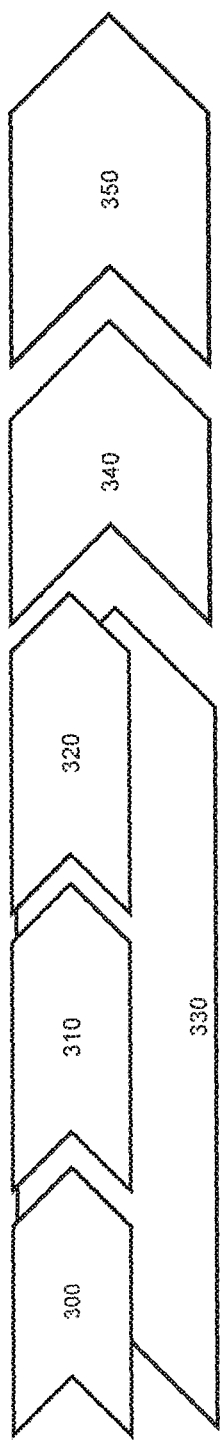
FIG. 3 schematically depicts a flow diagram of an embodiment of part of device manufacturing process development, monitoring and control.

Referring to FIG. 3, a high level overview of a development, monitoring and control process is shown. These various steps shown in FIG. 3 are each implemented at least in part with software. In an embodiment, the software associated with each of the steps is integrated together so that results, designs, data, etc. as applicable from one of the portions of the integrated software application may be shared as, e.g., an input to another one of the portions of the integrated software application.

As noted above, at 300, the lithographic apparatus may be setup for executing the lithography aspect of the device manufacturing process and optionally, may be configured to correct for deviations occurring within the lithographic apparatus or in other processes in the device manufacturing process. Such setup includes setting one or more parameters of the lithographic apparatus.

In an embodiment, the setup may include establishing a baseline setup of a lithographic apparatus and enabling the subsequent monitoring of the lithographic apparatus and adjustment of one or more parameters of the lithographic apparatus. For example, a lithographic apparatus can be set up for optimal operation as its baseline setup. Such a setup may be matched to other lithographic apparatuses in the factory. But, over time, system performance parameters will drift. Besides stopping production and recalibrating or rematching, one or more monitor substrates may be exposed and measured, e.g., using metrology system MET, to capture one or more performance parameters of the lithographic apparatus, such as the lithographic apparatus' overlay grid and focus calibration state per substrate table. Based on these measurements, one or more parameters are identified whose correction or change would be able to return the lithographic apparatus to its baseline setup. Further, updated values of the identified one or more parameters are calculated to return the lithographic apparatus to optimal operation. Then while production continues, the one or more lithographic apparatus parameters are automatically updated based on the measured parameters to return the lithographic apparatus to its baseline. Such a "reset" may occur, for example, once a day or other recurring time period. Optionally, the software can decide when the updates should be applied and whether they need to be overwritten on the lithographic apparatus or switched off for a certain time. An example of such software is ASML's Baseliner software.

In an embodiment, one or more inspection apparatus may be setup for executing the lithography aspect of the device manufacturing process and optionally, may be configured to correct for deviations occurring within the inspection apparatus or in other processes in the device manufacturing process. Such setup includes setting one or more parameters of the inspection apparatus. Such an inspection apparatus may a diffraction-based overlay metrology tool that can measure, e.g., overlay, critical dimension and/or other parameters. Such an inspection apparatus may be an alignment apparatus used to measure relative position between two objects, such as between a patterning device and a substrate. Such an inspection apparatus may be a level sensor to measure a position of a surface, e.g., a height and/or rotational position of a substrate surface.

In an embodiment, the setup may include establishing a baseline setup of an inspection apparatus and enabling the subsequent monitoring of the inspection apparatus and adjustment of one or more parameters of the inspection apparatus. For example, an inspection apparatus can be set up for optimal operation as its baseline setup. Such a setup may be matched to other inspection apparatuses in the factory. But, over time, system performance parameters will drift. Besides stopping production and recalibrating or rematching, one or more monitor substrates may be exposed and measured, e.g., using the inspection apparatus or metrology system MET, to capture one or more performance parameters of the inspection apparatus. Based on these measurements, one or more parameters are identified whose correction or change would be able to return the inspection apparatus to its baseline setup. Further, updated values of the identified one or more parameters are calculated to return the inspection apparatus to optimal operation. Then while production continues, the one or more inspection apparatus parameters are automatically updated based on the measured parameters to return the inspection apparatus to its baseline. Such a "reset" may occur, for example, once a day or other recurring time period. Optionally, the software can decide when the updates should be applied and whether they need to be overwritten on the inspection apparatus or switched off for a certain time.

At 310, metrology may be setup for the device manufacturing process. In an embodiment, this setup includes design of one or more metrology targets for the device manufacturing process. For example, one or more overlay metrology targets for exposing on a substrate during production may be developed. Further, a metrology recipe for the one or more metrology targets may be developed. A metrology recipe is one or more parameters (and one or more associated values) associated with the metrology apparatus itself used to measure the one or more metrology targets and/or the measurement process, such as one or more wavelengths of the measurement beam, one or more types of polarization of the measurement beam, one or more dose values of the measurement beam, one or more bandwidths of the measurement beam, one or more aperture settings of the inspection apparatus used with the measurement beam, the alignment marks used to locate the measurement beam on the target, the alignment scheme used, the sampling scheme, the layout of the metrology targets and the movement scheme to measure the targets and/or points of interest of a target, etc. In an embodiment, the one or more metrology targets may be qualified for the device manufacturing process. For example, a plurality of metrology target designs may be evaluated to identify the one or more metrology targets that minimize residual variation (systematic and/or random). In an embodiment, a plurality of metrology target designs may be evaluated to identify the one or more metrology targets whose performance match the device, e.g., identify a metrology target whose measure of overlay error matches the overlay error of the device. The metrology target may be design, e.g., for measurement of overlay, of focus, of critical dimension (CD), of alignment, of asymmetry in the target, etc. and any combination thereof.

Further, a device manufacturing process may have a particular systematic variation (fingerprint) arising from the nature of the process. For example, the device manufacturing process may call for use of particular substrate tables in the lithocell LC, use of specific etching or development types, use of particular baking parameters, use of particular focus and dose settings, etc. which may result in a particular regular variation in the exposure of a plurality of substrates. So, at 320, the process may be setup by determining a correction to be applied to one or more parameters of the device manufacturing process (e.g., one or more parameters of the lithographic apparatus, one or more parameters of the track, etc.) to account for a systematic variation arising from the particular device manufacturing process. This may result in a high order set of corrections to the baseline setup as described above. To arrive at the correction, the process fingerprint may be estimated by simulation and/or by measurements of substrates exposed in a development phase. From the process fingerprint, one or more lithographic and/or process correction models may be developed that can be applied to modify the lithographic apparatus, the track, etc. to at least partially correct the process fingerprint.

The lithographic apparatus setup 300, metrology setup 310 and process setup 320 may be together considered part of a process development phase 330. In addition to process development, steps should be taken to monitor and control the device manufacturing process during high volume manufacturing (HVM).

At 340, the metrology process is configured to enable measuring of the one or more metrology targets to enable monitoring and control of the device manufacturing process at 350. It may be too time consuming to measure every metrology target for every substrate of every lot (a lot is a batch of substrates of typically identical characteristics that are processed together during a run of the device manufacturing process; a lot of substrates is typically kept together in a movable container such as a FOUP). So, a measurement sampling scheme may be established for measuring the one or more metrology targets. A sampling scheme for a metrology process may include one or more parameters selected from: number of substrates per lot sampled; numeric designation of the substrate(s) in a lot or per lot sampled; number of fields sampled; locations of sampled fields on the substrate; number of sites in each field; locations of the sites in the field; frequency of samples; type of metrology target; or measurement algorithm. In an embodiment, the sampling scheme is designed to minimize variation. For example, the sampling scheme may be selected to minimize substrate to substrate variation, lot to lot variation, and/or machine to machine variation (e.g., variation between lithographic apparatuses in a factory). Further, one or more key performance indicators (KPIs) may be identified and one or more thresholds associated with the KPIs may be determined to enable process control. For example, mean, variation, etc. may be identified as KPIs and thresholds (e.g., value not to exceed, value not to go below, etc.) may be determined to use as control limits of the process. Further, it is possible to model the measurement results of the metrology targets using one or more measurement data mathematical models that are appropriately parameterized (i.e., a mathematical model with appropriately decided and defined parameters, and values thereof as applicable, to fit (where fit means not necessarily a perfect fit with all data) data to the mathematical model). So, a measurement data mathematical model may be established for measuring the one or more metrology targets. In an embodiment, the measurement data mathematical model and sampling scheme are established together. In an embodiment, the mathematical model may comprise one or more basis functions specified by one or more parameters; typically, the mathematical model may comprise a combination of a plurality of basis functions. In an embodiment, the mathematical model is parameterized with values for the parameters to fit the data.

Figure 4:
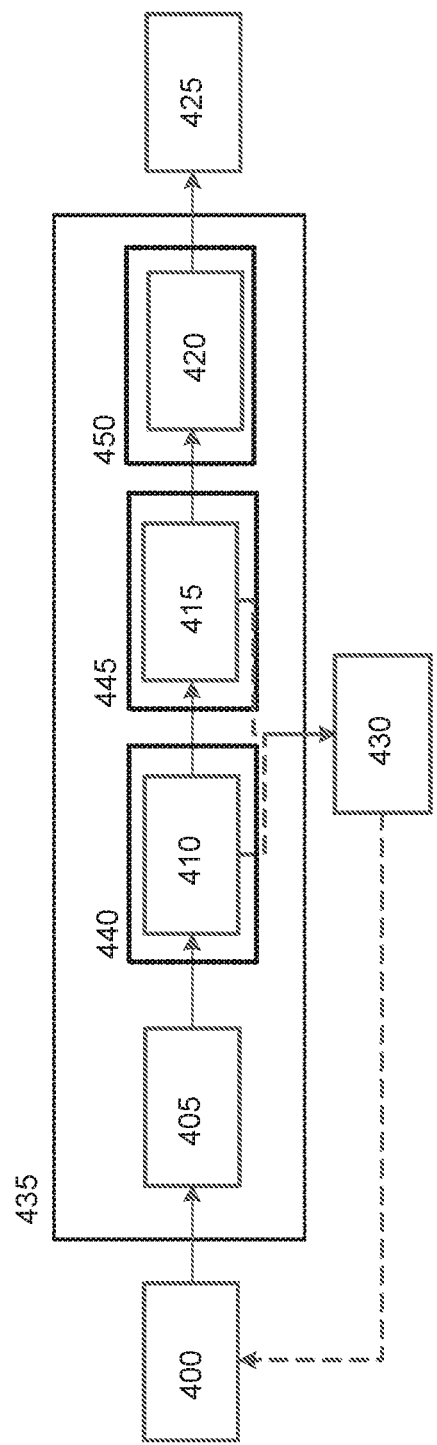
FIG. 4 schematically depicts a flow diagram of an embodiment of metrology setup.

Referring to FIG. 4, a more detailed flow diagram of an embodiment of metrology setup is depicted. At 400, data for the design of one or more metrology targets is obtained or provided. For example, the data may include, for example, information regarding the nature of one or more layers produced using the device manufacturing process (and to which the one or more metrology targets would be applied). This may be referred to as stack information. Such data may include information regarding parameters such as layer thickness, layer material, layer refractive index, layer absorption index, etc. and may include variation data associated with such parameters (e.g., a range of expected variation associated with the parameters). The data may include, for example, information regarding the nature of the one or more processes associated with the one or more layers. Such data may include the type and/or parameters of etch, the type and/or parameters of post-exposure baking, the type and/or parameters of development of resist, etc. and may include variation data associated with such parameters (e.g., a range of expected variation associated with the parameters). The data may include, for example, an overlay tree, which specifies between which layers of a plurality of layers overlay measurement is desired.

At 405, one or more metrology target designs are determined. In an embodiment, the one or more metrology targets design are determined by a simulation program that simulates the device manufacturing process and the measurement process of candidate target designs based on, e.g., the applicable full layer stack, to allow design parameters of the target for a given layer to be optimized. Thus, in the simulation, one or more design parameters of the target may be fixed or allowed to vary. Such parameters may include the pitch of a periodic structure of the target, a critical dimension of features of a periodic structure of the target, a thickness, etc. Further, one or more parameters of the metrology recipe (e.g., measurement beam wavelength, measurement beam polarization, measurement beam dose, aperture setting associated with the measurement beam, etc.) may be fixed or allowed to vary. In an embodiment, the software accepts, or provides a user interface to allow definition of, specification of the stack and process (e.g., layer material, etch type, deposition type, polishing (e.g., CMP) process, etc.), indications of which one or more parameters may be fixed and which may vary, specification of the range of variability of varying parameters, design rules or constraints, etc.

Once the starting conditions are specified, the software can run a simulation to identify one or more metrology target designs, one or more metrology recipes (e.g., for a particular metrology target design) and/or one or more combinations of metrology design and metrology recipe that meet printability, detectability, throughput, process stability (e.g., sensitivity to process variation), and/or tool dependency (e.g., a sensitivity to an inspection apparatus-specific parameter) specifications. The overlay accuracy and lens aberration performance can be further determined through simulation.

So, for example, based on the conditions of the stack and the device manufacturing process, a simulation model (such as an image/resist model and resist processing model that optionally may be particularly configured for the capabilities of a particular lithographic or other apparatus) may be used to determine how various metrology target designs with different design parameters and/or how various metrology target recipes with different recipe parameters, would be produced for the applicable device manufacturing process. For example, by including information regarding the exposure process, the sensitivity of metrology target design to projection system aberration can be matched to that of critical device features being printed in the specified layer, enabling overlay gains. Further, a simulation model of the measurement process (e.g., a diffraction simulation model that optionally may be particularly configured for the measurement capabilities of a particular inspection apparatus) may be used to evaluate the various metrology target designs against a specified or varying metrology recipe (e.g., different wavelengths, different polarizations, different doses, etc.) and/or evaluate a metrology target design for varying metrology recipes. The result may be a ranking by, or measure of, performance (e.g., printability, detectability, throughput, process stability, tool dependency, etc.) of various metrology target designs and/or metrology recipes to allow selection by a user, or by automatic process, of one or more metrology target designs and/or one or more metrology recipes. Where one or more parameters of the metrology recipe are allowed to vary, the results for a metrology target design may include an associated specification of the one or more parameters of the metrology recipe for the various metrology target designs. So, for example, a ranking may be presented of the metrology target designs, may be presented of the metrology target designs, may be presented of combinations of metrology target design and metrology recipe (such that, for example, a particular metrology target design may have multiple metrology recipes yielding multiple combinations of a same metrology target design with different metrology recipes, etc.) where the base ranking may be on the metrology target design or on the metrology recipe, etc.

Further, in an embodiment, the robustness of the various metrology target designs and/or metrology recipes to process variation may be evaluated by allowing a perturbation of one of more parameters (e.g., according to variation data) to determine sensitivity of the various metrology target designs and/or metrology recipes to various parameter perturbations. The perturbation may be to an etch parameter, to a polishing process parameter, to critical dimension of a structure of the target, etc. The result may be a ranking by, or measure of, robustness of various metrology target designs and/or metrology recipes to allow selection by a user, or by automatic process, of one or more metrology target designs and/or metrology recipes. One or more of the identified metrology target designs and/or metrology recipes may be selected for use or further evaluation and where a metrology target design is involved, the software may output a patterning device pattern for the one or more identified metrology target design in, e.g., GDS format. Thus, the software can evaluate thousands, if not millions, of metrology target designs and/or metrology recipes and thus allow the design space to be well explored by identifying metrology target designs and/or metrology recipes that balance precision and accuracy.

At 410, the one or more metrology target designs and/or metrology recipes from 405 (typically a plurality of metrology target designs and/or metrology recipes) are further evaluated experimentally. In particular, a plurality of metrology recipes for an inspection apparatus may be determined for each metrology target design (which may include the one or more metrology recipes from 405 where one or more metrology recipes are output) and then the one or more metrology target designs are created and measured at each metrology recipe using the inspection apparatus. Each metrology target design is evaluated against the plurality of metrology recipes to enable determination of a suitable or optimal recipe. In an embodiment, a total measurement uncertainty of one or more of the metrology target designs is determined. In an embodiment, the accuracy (e.g., by use of a residual) of one or more of the metrology target designs is determined. From the various results, a ranking by, or measure of, performance of the evaluated one or more metrology target designs and/or metrology recipes may be created to allow selection by a user, or by automatic process, of one or more metrology target designs and/or metrology recipes from the evaluated one or more metrology target designs and/or metrology recipes.

At 415, the one or more metrology target designs and/or metrology recipes from 410 (typically a plurality of metrology target designs and/or metrology recipes) are further evaluated experimentally. In an embodiment, the accuracy (e.g., by use of a residual) of one or more of the metrology target designs and/or metrology recipes is determined. From the various results, a ranking by, or measure of, performance of the evaluated one or more metrology target designs and/or metrology recipes may be created to allow selection by a user, or by automatic process, of one or more metrology target designs and/or metrology recipes from the evaluated one or more metrology target designs and/or metrology recipes.

At 420, where, e.g., more than one inspection apparatus is used to measure the one or more metrology targets in, e.g., process development and/or HVM and/or a different inspection apparatus is used for evaluation than in, e.g., process development and/or HVM, the one or more metrology target designs and/or metrology recipes from 410 (typically a plurality of metrology target designs) are further evaluated experimentally using the plurality of inspection apparatuses. In an embodiment, a correction for one or more of the inspection apparatuses may be determined based on the measurements of the one or more metrology target designs and/or with the one or more metrology recipes. In an embodiment, the correction may be such that the inspection apparatuses having matching performance.

At 425, the one or more identified and evaluated metrology target designs and/or metrology recipes are ready for use in HVM. Where there is a plurality of metrology target designs and/or metrology recipes, a user may select which one or more metrology target designs and/or metrology recipes are appropriate for the device manufacturing process.

At 430, feedback information may be provided for the next preparation and supply of data 400. Using the feedback information, the data 400 may be improved or better selected.

Referring to 435, the processes 405, 410, 415 and 420 would be repeated for each layer/metrology step. That is, those processes are repeated for each layer designed to have a metrology target being measured by a measurement step and for each measurement step involving that layer (e.g., a target in a layer may be used for measuring different layers, whether at a same measurement time or at different times in the device manufacturing process). So, a plurality of metrology target designs are evaluated for each layer designed to have a metrology target and further evaluated against each measurement step associated therewith.

Referring to 440, process 410 is repeated per metrology target design and/or metrology recipe, which may be each metrology target design and/or metrology recipe from process 405. For example, it may involve evaluating about 10-40 metrology target designs. The outcome of process 410 may be one or more of the starting metrology target designs and/or metrology recipes, e.g., a subset of 2-15 metrology target designs. Referring to 445, process 415 is repeated per metrology target design and/or metrology recipe, which may be each metrology target design and/or metrology recipe from process 410. For example, it may involve evaluating about 2-15 metrology target designs. The outcome of process 415 may be one or more of the starting metrology target designs and/or metrology recipes, e.g., a subset of 1-10 metrology target designs. Referring to 450, process 420 is repeated per metrology target design and/or metrology recipe, which may be each metrology target design and/or metrology recipe from process 415. For example, it may involve evaluating about 1-10 metrology target designs. The outcome of process 420 may be one or more of the starting metrology target designs and/or metrology recipes, e.g., 1-5 metrology target designs.

Figure 5:
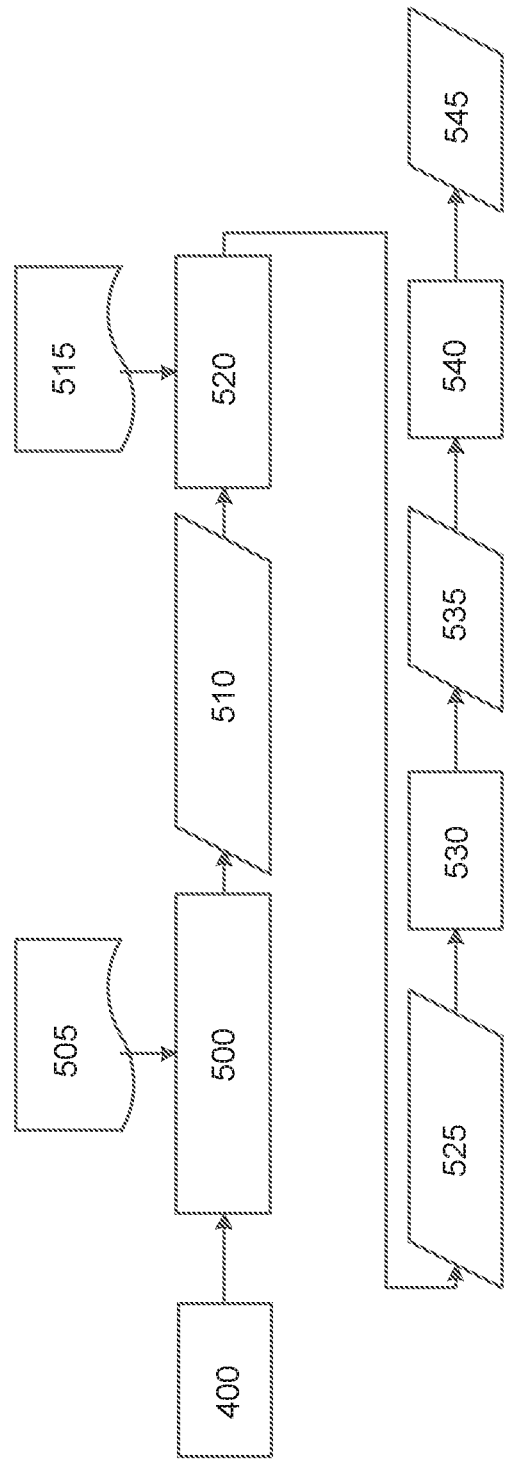
FIG. 5 schematically depicts a flow diagram of an embodiment of metrology target design.

Referring to FIG. 5, details of an embodiment of process 405 are presented. As described above, using data 400, one or more metrology targets design are determined at 500 by a simulation program that simulates the device manufacturing process and the measurement process of candidate target designs based on, e.g., the applicable full layer stack, to allow design parameters of the target for a given layer to be optimized. As noted above, in the simulation, one or design parameters of the target may be fixed or allowed to vary. Such parameters may include the pitch of a periodic structure of the target, a critical dimension of a structural feature, a thickness, etc. Further, one or more parameters of the metrology recipe (e.g., measurement beam wavelength, measurement beam polarization, measurement beam dose, aperture setting associated with the measurement beam, etc.) may be fixed or allowed to vary. In an embodiment, at 505, the software accepts, or provides a user interface to allow definition of, specification of the stack and process (e.g., layer material, etch type, deposition type, polishing (e.g., CMP) process, etc.), indications of which one or more parameters may be fixed and which may vary, specification of the range of variability of varying parameters, design rules or constraints, etc.

At 510, a ranking by, or measure of, performance (e.g., printability, detectability, robustness, etc. or a combination thereof, including a weighted combination) of various metrology target designs are provided to allow selection by a user, or by automatic process, of one or more metrology target designs. The output may be hundreds, if not thousands, of metrology target designs. As discussed above, the metrology target designs may also be associated with one or parameters of a metrology recipe, particularly where one or more metrology recipe parameters are variable during simulation. The performance of the metrology target design can be characterized by various parameters such as, for example, target coefficient (TC), stack sensitivity (SS), overlay impact (OV), asymmetry (as described herein), diffraction efficiency (as described herein) or the like. Stack sensitivity can be understood as a measurement of how much the intensity of the signal changes as overlay changes because of diffraction between target (e.g., grating) layers. Target coefficient can be understood as a measurement of signal-to-noise ratio for a particular measurement time as a result of variations in photon collection by the measurement system. In an embodiment, the target coefficient can also be thought of as the ratio of stack sensitivity to photon noise; that is, the signal (i.e., the stack sensitivity) may be divided by a measurement of the photon noise to determine the target coefficient. Overlay impact measures the change in overlay error as a function of target design. Further, the performance of the metrology target design can be characterized by its robustness to variation, e.g., its sensitivity to variation of one or more process parameters.

At 515, one or more metrology target designs (and associated metrology recipe parameters, if applicable) from the plurality of metrology target designs at 510 are manually, or by automated process, selected. At 515, one or more guides, restrictions or thresholds may be provided to facilitate selection of one or more metrology target designs. For example, a manual or automated criteria may be selection of a certain number of highest ranked metrology target designs from 510. The ranking may be based on a single performance parameter, on a combination of performance parameters, or a weighted combination of performance parameters, etc. Another manual or automated criterion may be selection of a metrology target design passing a certain threshold for a performance parameter, optionally if those metrology target designs do or do not pass another threshold. For example, the manual or automated criteria may be evaluation of metrology target designs against stack sensitivity in relation to target coefficient.

At 520, the selected one or more metrology target designs (and associated metrology recipe parameters, if applicable) from 515 are output along with the specifications of the metrology target designs (and associated metrology recipe parameters, if applicable). The selection may be 10-40 metrology target designs per layer.

At 530, an optical proximity correction process may be performed to convert the metrology target design into a design for a patterning device (e.g., a mask). The fundamental metrology target design may not be directly converted into a pattern of, or for, a patterning device and yield the designed metrology target on a substrate. Accordingly, various optical proximity correction techniques, such as serifs, biases, scattering bars, etc., may need to be added to the metrology target design to create a metrology target design suitable for a patterning device. The output at 535 may be a metrology target design pattern for a patterning device in, e.g., GDS format for each metrology target design.

At 540, the one or more patterning device patterns of the metrology target designs may be inserted into the device pattern of the one or more patterning devices for the device manufacturing process. The result from this would include information 545 regarding the selected one or more metrology target designs and locations of the patterns of the selected one or more metrology target designs in the device pattern of the one or more patterning devices for the device manufacturing process.

Figure 6:
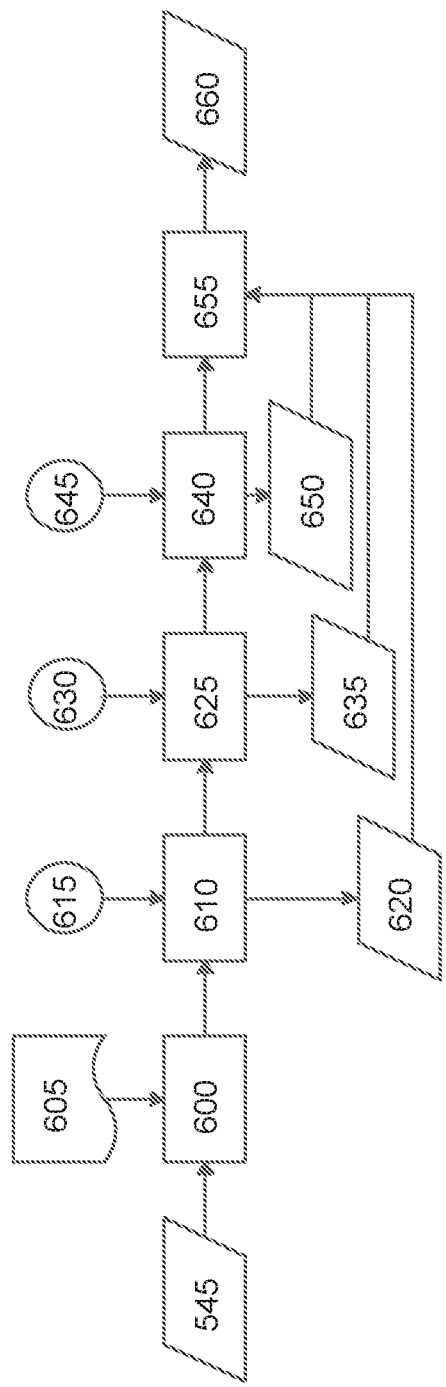
FIG. 6 schematically depicts a flow diagram of an embodiment of metrology target design selection and qualification.

Referring to FIG. 6, details of an embodiment of processes 410 and 415 are presented. Using information 545, one or more metrology recipes (typically a plurality of metrology recipes) for each of the selected one or more metrology target designs are generated. As noted above, a metrology recipe comprises one or more parameters (and one or more associated values) associated with the metrology apparatus itself used to measure the one or more metrology targets and/or the measurement process, such as one or more wavelengths of the measurement beam, one or more types of polarization of the measurement beam, one or more doses of the measurement beam, one or more bandwidths of the measurement beam, one or more aperture settings on the inspection apparatus associated with the measurement beam, the alignment marks used to locate the measurement beam on the target, the alignment scheme used, the sampling scheme, the layout of the metrology targets and the movement scheme to measure the targets and/or points of interest of a target, etc.

To enable generation of the one or more metrology recipes, metrology recipe template information 605 may be provided. The metrology recipe template information 605 may define generic details regarding one or more parameters of a metrology recipe such as alignment marks used to locate the measurement beam on the target, the alignment scheme used, the size of the measurement beam spot, sampling schemes, etc.

At 610, a metrology recipe optimization process is performed to determine one or more suitable metrology recipes for each metrology target design. To do so, measurements results 615 from one or more substrates patterned with the one or more metrology target designs and measured at the one or more generated metrology recipes may be analyzed. In an embodiment, such results are from a select number of targets exposed on a substrate (i.e., a sample of the targets). One or more performance parameters may be calculated for combinations of metrology recipe and metrology target design and evaluated to determine which one or more metrology recipes are most suitable. Results information, e.g., optimization performance results, may be generated at 620.

At 625, a total measurement uncertainty (TMU) of the one or more metrology target designs using one or more selected metrology recipes from 610 is determined. To do so, measurements results 630 from one or more substrates patterned with the one or more metrology target designs and measured at the one or more selected metrology recipes may be analyzed. In an embodiment, such results are from a select number of targets exposed on a substrate (i.e., a sample of the targets). In an embodiment, any combinations of metrology target design and selected metrology recipe that equal or exceeds a threshold value of TMU may be ruled out for further evaluation. Results information, e.g., TMU verification results, may be generated at 635.

At 640, the accuracy (e.g., by use of a residual) of one or more of the metrology target designs is determined. In an embodiment, the one or more metrology target designs and their one or more associated metrology recipes that have sufficient TMU from 625 are analyzed. To determine the accuracy, measurements results 645 from one or more substrates patterned with those one or more metrology target designs and measured at their associated one or more metrology recipes may be analyzed. In an embodiment, such results are from all, nearly all, or at least the majority, of targets exposed on a substrate. In an embodiment, such results are from less than the majority of targets exposed on a substrate where, for example, an appropriate sampling scheme is used. From the measurement results, the accuracy of the metrology target designs may be evaluated by computing a residual between the measurement results and a parameterized measurement data mathematical model used to describe the measurement results. Those metrology target designs with a low residual are those that are more accurate. Information, e.g., accuracy performance results and optionally inspection apparatus corrections to reduce or minimize the residual, may be generated at 620. Further, correction settings for the inspection apparatus for use during process control may be determined at 650.

In an embodiment, the process 625 may be performed after process 640.

At 655, the one or more metrology target designs along with their one or more metrology recipes are evaluated to identify a subset of metrology target designs suitable for further evaluation. The evaluation may be performed on the results from process 610, 625, 640 or any combination selected therefrom. For example, a ranking by, or measure of, performance of the evaluated combinations of metrology target design and metrology recipe may be created to allow selection by a user, or by automatic process, of one or more metrology target designs (and its associated metrology recipe) from the evaluated combinations of metrology target design and metrology recipe.

At 660, a list of selected one or more metrology target designs are generated, which list may include the details of the one or more metrology target designs and details of the associated one or more metrology recipes. Where metrology targets are measured with only a single inspection apparatus, the list may be ready for use in HVM, particularly where the inspection apparatus used is one used in HVM.

Figure 7:
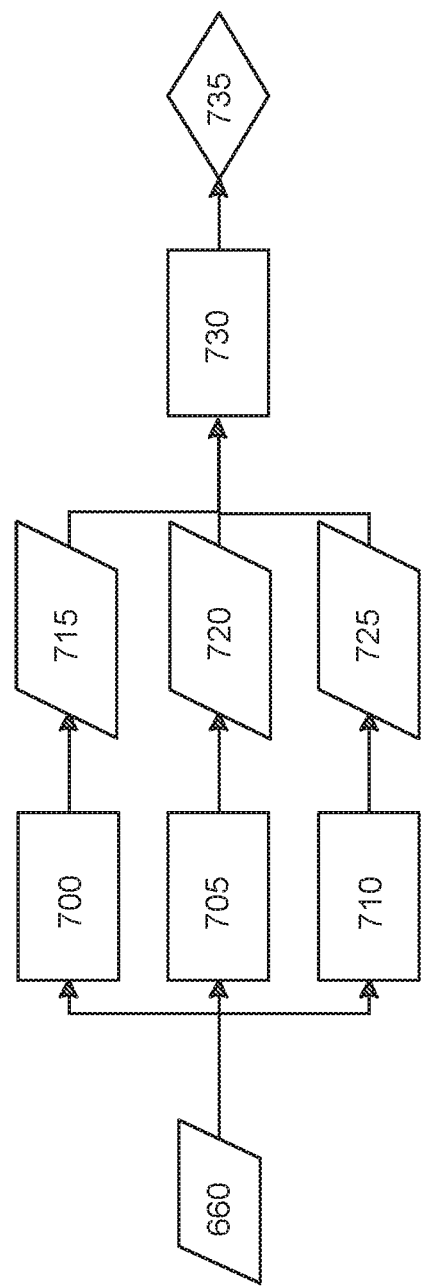
FIG. 7 schematically depicts a flow diagram of an embodiment of further metrology target design qualification.

Referring to FIG. 7, details of an embodiment of process 420 are presented where, e.g., more than one inspection apparatus is used to measure the one or more metrology targets in HVM and/or the inspection apparatus for evaluation is different from that used in HVM. From the data from 660, one or more combination of metrology target design and metrology recipe are selected. For each combination, the metrology target is patterned onto a substrate and then measured with an inspection apparatus using the metrology recipe. In this case, each combination is measured using a first inspection apparatus at 700, measured using a second inspection apparatus at 705, and measured using a third inspection apparatus at 710. In this example, there are three inspection apparatuses, but there may be more or there may be less. From the measurement results, an applicable correction 715, 720, 725 for the respective inspection apparatus may be determined, e.g., to reduce or minimize a residual. Further, at 730, the results from 700, 705, 710, results from 715, 720, 725, and/or performance parameters derived from any of the foregoing may be evaluated to determine matching performance between the inspection apparatuses. For example, if one or more combinations of metrology target design and metrology recipe perform better on the inspection apparatuses collectively than one or more other combinations then those combinations may be selected for HVM.

At 735, a list of selected one or more metrology target designs are generated for, e.g., HVM or for development of the manufacturing process, which list may include the details of the one or more metrology target designs and details of the associated one or more metrology recipes.

Figure 8:
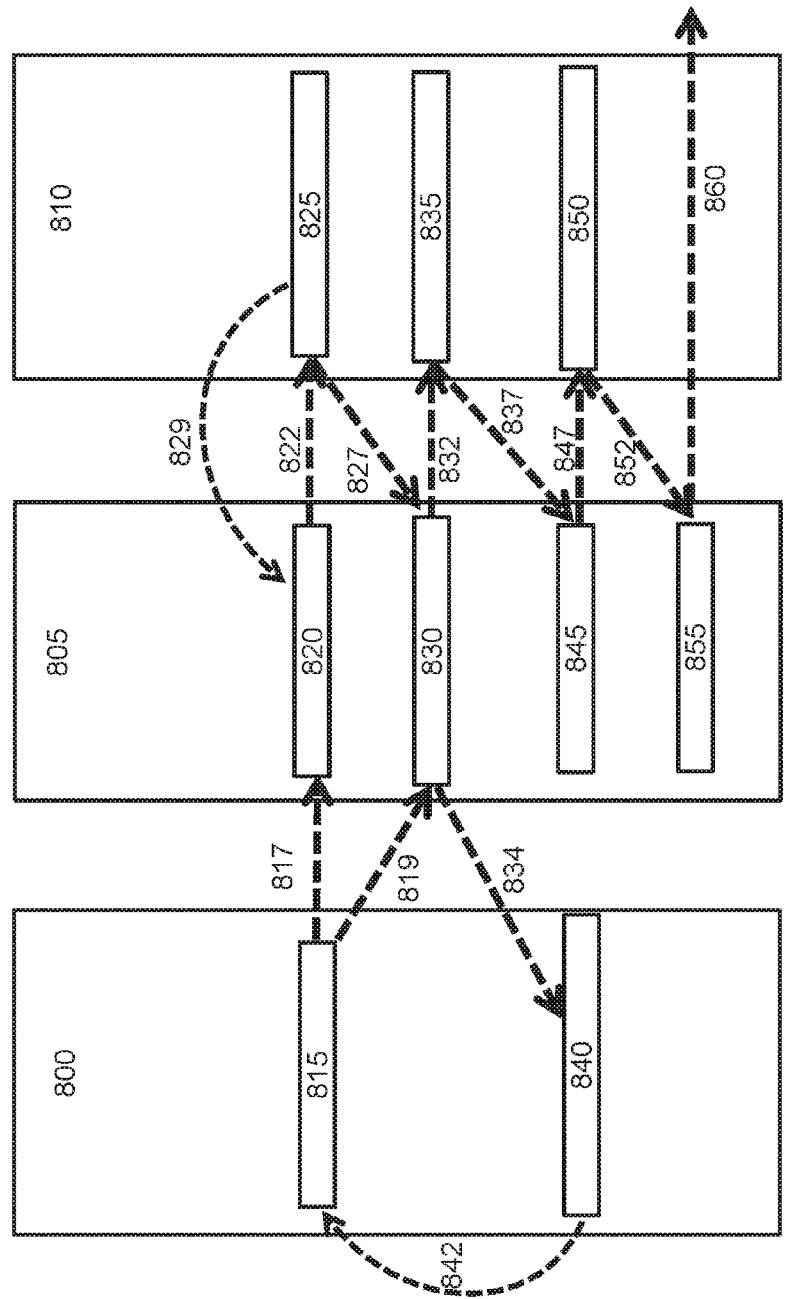
FIG. 8 schematically depicts a flow diagram of an embodiment of metrology target design, selection and qualification.

Referring to FIG. 8, a schematic flow diagram is depicted of an embodiment of metrology target design, selection and qualification. In this diagram, certain aspects of the flow are separated into general categories. A first category 800 of operations involves the design and selection of one or more metrology target designs by calculation or simulation. This roughly corresponds to the metrology target design 405 and all or parts of the process of FIG. 5, such as processes 500, 510, 520 and 525. A second category 805 of operations involves data analysis associated with of one of more of the metrology target designs selected in category 800 to select one or more metrology target designs for HVM. And, a third category 810 of operations involves collection of data for use in the one or more of the category 800 and/or 805 operations.

So, at 815, simulation steps as, for example, described above in respect metrology target design 405 and all or parts of the process of FIG. 5, such as processes 500, 510, 520 and 525 are performed, using various parameters including stack or other process conditions (e.g., information regarding material, dimensional and/or optical characteristics of the layer in which a metrology target, or portion thereof, is provided (such as an optical property, a material thickness, refractive index, absorption index, etc.), regarding one or more layers above that metrology target (e.g., thickness of a processing layer, refractive index of a processing layer, absorption index of a processing layer, etc.), regarding how a layer is processed (e.g., a polishing parameter, an etching parameter, etc.), regarding a characteristic of an inspection apparatus (as described further hereafter), regarding a setting of an inspection apparatus, regarding a characteristic of a lithographic apparatus, regarding an alignment strategy to measure the target, etc. and/or a measure of variation of any of the foregoing), to simulate performance of one or more different metrology target designs, which different metrology target designs may be created by the simulation by varying one or more metrology target design parameters (such as periodic structure pitch, a structural feature critical dimension, etc. and including one or more stack or other process conditions). As discussed above, the performance may be, and a performance parameter may represent, printability, detectability, precision, robustness, throughput, accuracy, asymmetry, diffraction efficiency (as described hereafter), inspection tool specific parameter (e.g., sensitivity to sensor artifacts as described hereafter), etc. or a combination thereof.

The metrology target designs may be ranked or otherwise evaluated based on their simulated performance (which is at nominal stack information). In an embodiment, the simulation is performed at a range of stack or other processing conditions around an expected or, as described hereafter, a measured processing condition. The range may be defined by a user.

As described above, the simulation may be performed using various different metrology recipe parameters (e.g., different measurement beam wavelength, different measurement beam polarization, different measurement beam dose, etc. or any combination thereof) and different values thereof.

Thus, the results may be a combination of metrology target design and one or more metrology recipe parameters (and associated values) that, e.g., rank highly, pass a threshold, etc.

From the simulation, one or more of the metrology target designs may be selected to provide an initial set of metrology target designs. These metrology target designs are output at 817. The data at 817 may further include the stack information, the simulated performance of the metrology target designs, their ranking and/or specification of one or more associated metrology recipe parameters.

At 820, based on the data of 817, software generates one or more metrology recipes (typically a plurality of metrology recipes) for one or more, if not all, of the metrology target designs at 817 for metrology target design performance evaluation. This step generally corresponds to step 600 described above. In an embodiment, the metrology recipes comprise combinations of all specific wavelengths and polarizations available at the inspection apparatus. In an embodiment, the one or more metrology recipes for a particular metrology target design comprise one or more of the associated metrology recipe parameters (and associated value(s) thereof) from data 817. In an embodiment, the one or more metrology recipes for a particular metrology target design may comprise a range of values around or with respect to the value(s) of the one or more of the associated metrology recipe parameters from data 817. For example, if data 817 specifies a measurement beam wavelength then the one or more metrology recipes may include those with that measurement beam wavelength and/or in a range around or with respect to that measurement beam wavelength (e.g., a range of 50, 100, 150, 200, 250, 300 or 350 nm). The recipes are output at 822.

At 825, the metrology target designs for which recipes are generated at 820 are formed onto a plurality of substrates processed using the device manufacturing process and then measured with an inspection apparatus using the recipes of 822. This step generally corresponds to step 615. As discussed above in respect of step 615, the data collection may be a sample of the targets on a substrate to aid speed of evaluation. In an embodiment, a programmed variation to a measured or derived parameter may be introduced. For example, where the measurements relate to overlay, a known programmed overlay error may be introduced to help performance evaluation. The output 827 would be, e.g., overlay data for each of a plurality of metrology target designs. And for each metrology target design, there would be data for a plurality of recipes. In an embodiment, the data may represent measured values or parameters derived from measured values for one or more various metrology target design parameters and/or one or more various metrology recipe parameters. In an embodiment, the data collected at 825 may be data used to determine a parameter representative of sensitivity of one or more metrology recipes, or one or more metrology recipe parameters, to one or more metrology targets.

In an embodiment, measurements may be performed of a structure (e.g., a periodic structure) of a metrology target design to determine a parameter representative of variation of the structure due to process variability. For example, the structure may have an asymmetry due to variability in processing of the structure and/or one or more layers above the structure. In an embodiment, to obtain such measurements, specific markers or features may be used to measure such variation. Such specific markers or features may also be used to monitor the device manufacturing process. In an embodiment, where the metrology target design comprises a lower periodic structure and an upper periodic structure, the measurements may be performed of a lower periodic structure of a metrology target design without an associated upper periodic structure of a metrology target design being located over the lower periodic structure at the time of measurement.

Thus, these measurements can represent a process variation arising in the creation of the structure of the metrology target and/or of one or more layers overlying the structure (and can be then be used to arrive at a robustness of a metrology target design to process variability). For example, these measurements can represent an amount of asymmetry present in the structure, e.g., the lower periodic structure of a metrology target design having an upper periodic structure. For example, low asymmetry can represent a robust target or target parameter. For example, a set of data may represent values of asymmetry for different combinations of wavelength and polarization for each of a plurality of metrology target designs. Such data, for example, may represent, or be used to derive, a parameter representative of sensitivity of one or more metrology recipes, or one or more metrology recipe parameters, to one or more metrology targets since such data show how different recipes measure a same target. As another example, a set of data may represent values of asymmetry for different values of metrology target design parameter, such as pitch of a periodic structure of metrology target designs, a critical dimension of a structural feature of metrology target designs, segmentation of features of a periodic structure of metrology target designs, etc. As another example, a set of data may represent measured intensities for various metrology target design parameter or metrology recipe parameter.

Additionally, the measurements may be taken at different stages of the device manufacturing process to determine which process steps are likely causing variability of the results, e.g., causing deformation of the structure of the metrology target. That is, in an embodiment, the asymmetry (as an example) may be measured after each layer, or after a certain number of layers, of the stack is applied to investigate which of the layers in the device manufacturing process causes the asymmetry to occur. This allows a layer by layer analysis of the stack, which can be used for the tuning as described herein.

In an embodiment, one or more properties may be varied at one or more of these different stages to help determine if a metrology target design is robust to variation of the one or more properties. The one or more properties may comprise one or more selected from: an optical property of a layer (e.g., a material refractive index or a material absorption index), a material thickness, a polishing parameter and/or an etching parameter.

At 830, the data 827 is evaluated to filter combinations of metrology target design and recipes based on performance. This step generally corresponds to step 610 and optionally 625. For example, the data 827 is processed to determine one or more parameters regarding the performance of the metrology target designs and/or the metrology recipes. In an embodiment, the software generates one or more performance parameters regarding detectability, precision, throughput and/or accuracy. Based on metrology target performance information from data 827 (e.g., the data itself and/or a generated performance parameter), one or more metrology target designs and associated one or more metrology recipes are manually, or by automated process, selected. In an embodiment, additionally or alternatively to selecting based on the metrology target performance information from data 827, the one or more metrology target designs and associated one or more metrology recipes are manually, or by automated process, selected based on data (such as a parameter representing performance of one or more of the metrology targets and/or metrology recipes) from the simulation 815 (e.g., obtained from 817 and/or 819). In an embodiment, the selecting is based on metrology target performance information from data 827 and on data from the simulation at 815. In an embodiment, the simulation is performed based on a tuning of the metrology target parameter or metrology recipe parameter as described hereafter and the selecting is based on data from the simulation at 815 that is based on the tuning of the metrology target parameter or metrology recipe parameter. In an embodiment, the simulation is performed based on a tuning of the metrology target parameter or metrology recipe parameter as described hereafter and the simulation evaluates one or more new or varied metrology targets and/or metrology recipes. In an embodiment, measurement data of the one or more new or varied metrology targets and/or metrology recipes is obtained and the selecting is based on measurement data of the one or more new or varied metrology targets and/or metrology recipes (in addition or alternatively to being based on data from the simulation at 815).

In an embodiment, combinations of metrology target design and metrology recipe are ranked according to one or more performance parameters individually (which performance parameters themselves may be derived from a plurality of performance parameters, e.g., a weighted combination of performance parameters) and/or according to combinations of performance parameters (e.g., ranked separately on two or more performance parameters or ranked based on a combination of two or more performance parameters). In an embodiment, the ranking of combinations of metrology target design and metrology recipe may be presented in a user interface (e.g., a graphical user interface). In an embodiment, one or more combinations of metrology target design and metrology recipe may be automatically selected if they pass a threshold. These promising metrology target designs and metrology recipes can then be analyzed, as discussed herein, for accuracy validation. The selected metrology target designs and metrology recipes, and optionally their performance, are output at 832.

In an embodiment, a parameter representative of sensitivity of one or more metrology recipes, or one or more metrology recipe parameters, to one or more metrology targets, such as a parameter representing variation of a structure of the metrology target due to process variability (e.g., derived from measurements performed of a lower periodic structure of a metrology target design without an associated upper periodic structure of a metrology target design being located over the lower periodic structure at the time of measurement), are fed-forward at 827 for use in the evaluation process of complete metrology target design. In an embodiment, the measurements are used to determine which one or more measurements settings have a high or low sensitivity to process variation arising in the creation of the structure of the metrology target and/or of one or more layers overlying the structure. Thus, in an embodiment, the measurements are used to determine which one or more measurements settings have a high or low sensitivity to deformation of the structure, e.g., periodic structure asymmetry. These results can then be used in evaluation of the complete metrology target design at 830 to identify and/or select one or more metrology target designs that have one or more low or least sensitive settings. In an embodiment, the results may be fed-forward at 829 to creation of the metrology recipes such that metrology recipes are selected that have one or more low or least sensitive settings, which can facilitate throughput by eliminating metrology recipes that are highly sensitive to process variation.

In an embodiment, there is provided a method comprising: determining a parameter representative of sensitivity of one or more metrology recipes, or one or more metrology recipe parameters, to one or more metrology targets based on measurement data of a metrology target measured at a plurality of metrology recipes; and evaluating, based on the parameter representative of sensitivity, a plurality of metrology recipes used to measure the metrology target by simulation or against measured data to identify one or more recipes of the plurality of metrology recipes for use in measuring the metrology target. In an embodiment, the measurement data includes a parameter representing variation of a structure of the metrology target due to process variability. In an embodiment, the parameter represents a measure of asymmetry present in the structure of the metrology target. In an embodiment, the measurement data comprises measurements at different stages of processing of the structure and/or applying of layers above the structure. In an embodiment, the method further comprises varying a property of the processing of the structure. In an embodiment, the property of the processing comprises one or more selected from: an optical property of a layer, a material thickness, a polishing parameter and/or an etching parameter. In an embodiment, the structure of the metrology target is a lower periodic structure of the metrology target and the measurement data relates to the lower periodic structure without an upper periodic structure of the metrology target being located above the lower periodic structure at the time of acquisition of the measurement data.

At 834, feedback data from or, or generated from, the measurement data gathered at 825 is provided back to the simulation or calculation process at 800. This data can be used to verify the simulations, simulation parameters, and/or give simulation confidence. Thus, in an embodiment, the data is used to tune a metrology target parameter and/or metrology recipe parameter derived or used in the simulation.

In an embodiment, the data 834 may be, or comprises, values of one or more parameters of the stack, e.g., the thickness of one or more layers, the refractive index of one or more layers, the absorption index of one or more layers, etc., and/or a variability of one or more parameters regarding the stack, e.g., a measure of variability of thickness of one or more layers. This tuning may be of one or more layers at or above the target and/or one or more layers underneath the target. Such data 834 may be measured directly by a metrology tool. Such data 834 may be gathered by a metrology tool that is not designed to use the target, e.g., by a CD-SEM tool whereas the target is designed for use by a diffraction-based measurement tool.

In an embodiment, the data 834 may be, or comprise, indirect information regarding a metrology target parameter and/or metrology recipe parameter. For example, the data 834 may comprise values of measured intensities of radiation redirected by the measured metrology target designs, measured values of overlay, measured values of critical dimension, values of one or more parameters (KPIs) such as mean, standard deviation, stack sensitivity, target coefficient, asymmetry, diffraction efficiency, etc. derived from the measurement data, etc. In an embodiment, the data 834 may comprise measured data, or one or more parameters derived from measured data, that represent reproducibility of the metrology target design (i.e., an indicator of the ability of the metrology design to be actually produced in the stack as designed) and/or detectability (i.e., an indicator of the ability of an inspection apparatus to detect the metrology design).

At 840, this feedback data may be used to evaluate the correctness and/or consistency of one or more metrology target parameters and/or metrology recipe parameters of the simulation and an appropriate correction may be applied where there is lack of correctness and/or consistency. For example, one or more of the initial or expected stack or other process conditions used to run the simulation may be verified against the data 834 to verify the validity of the one or more initial or expected stack or other process conditions. If the one or more initial or expected stack or other process conditions is not valid (e.g., values of numbers do not match, variability of a parameter is greater than as used in the simulation, etc.), the simulation may be re-run using updated one or more stack or other process conditions supplied at 842. For example, one or more measured stack or other process conditions from the feedback data may be used in the simulation instead of the one or more of the initial or expected stack or other process conditions. The re-performance of the simulation may involve merely re-ranking of previously determined metrology target designs and/or metrology recipes based on the updated one or more stack or other process conditions or may involve determining one or more new metrology target designs and/or metrology recipes based on the updated one or more stack or other process conditions. Verification may range from simple comparison of numbers to complex statistical analysis. For example, measurement detectability of a metrology target design may be evaluated based on measurements of the metrology target design for a plurality of values of a metrology recipe parameter or for a plurality of metrology recipe parameter combinations. This may yield a set of data, or function, of measurement detectability against values of the metrology recipe parameter or of the plurality of metrology recipe parameter combinations. A comparable set of data, or function, may be derived from the simulation and then statistically compared. If there is no accuracy or consistency, a correction may be applied to the simulation. In an embodiment, the simulation may vary one or more metrology target parameters and/or metrology recipe parameters (such as one or more parameters of the stack) until there is a match with data 834 and then apply a correction based on that result. As an example, the simulation may vary one or more parameters of the stack until there is a match with data 834 and the values of the one or more parameters of the stack in the simulation at the time of match may be representative of the actual stack characteristics. The one or more parameters of the stack in the simulation at the time of match may then be used in subsequent simulations for that device manufacturing process. In an embodiment, measurements of critical dimension may be used to constrain the stack tuning and to get a better (physical) solution of the tuned stack.

Relatedly, if measurements are consistent with or confirm the accuracy of one or more metrology target parameters and/or metrology recipe parameters of the simulation, the simulation can use this information 842 to improve or optimize the metrology target design and/or metrology recipe. For example, strong correlations may be identified between parameters and used to guide the design of metrology target designs and/or metrology recipes to favor those parameters with strong correlation to parameters that represent good performance. For example, if measurement results of multiple metrology target designs (with varying metrology target design parameters) for, for example, a plurality of, or one or more applicable, metrology recipe parameters are consistent with or confirm the accuracy of one or more metrology target parameters and/or metrology recipe parameters of the simulation, then that information can be used by the simulation to improve or optimize the metrology target design and/or metrology recipe (e.g., by giving a greater weight to parameters with a stronger correlation to better performance, etc.).

In an embodiment, where correlation results between measured data and initial data in 840 flags one or more parameters of the stack and/or a variability of one or more parameters regarding the stack to be incorrect, measurements may be taken to obtain values of one or more parameters of the stack and/or a variability of one or more parameters regarding the stack. For example, such data may be collected at 825 and triggered to be collected responsive to 840 determining that one or more parameters of the stack and/or a variability of one or more parameters regarding the stack are incorrect. The initial data may be updated based on such data or be substituted with such data. From the correlation at 840, step 840 may determine specific one or more parameters of the stack and/or a variability of one or more parameters regarding the stack to be measured at 825. In an embodiment, step 840 may automatically prepare or provide a metrology recipe template for use 825 to measure the one or more parameters of the stack and/or a variability of one or more parameters regarding the stack that are determined to be incorrect.

In an embodiment, data 834 could be used as, or derived to be, a weight value used in the simulation to tune a metrology target parameter and/or metrology recipe parameter. For example, the weight value could effectively be used to eliminate one or more metrology target designs and/or metrology target recipes. As an example, data 834 representing reproducibility or detectability may be used as a "heavy" weight to rule out, or lower in rank, certain metrology target designs and/or metrology target recipes. The result could be faster simulation and more effective results.

In an embodiment, if a difference between one or more initial or expected stack or other process conditions or expected data and respectively one or more of the measured stack or other process conditions or the measured data remains within a threshold, then one or more metrology targets and/or recipes may be selected based on performance. In an embodiment, the performance is determined using a performance parameter or indicator comprising one or more selected from: detectability, precision, throughput, accuracy, diffraction efficiency, asymmetry, target coefficient, stack sensitivity, and/or sensitivity to sensor artifacts. In an embodiment, the selection is based on a balance between several performance parameters and/or a balance between a performance parameter and an inspection apparatus specific parameter.

In an embodiment, the feedback data used for consistency and/or accuracy evaluation may be feedback data that corresponds to one or more particular simulated metrology target designs and/or metrology recipes (e.g., measured data of a particular metrology design is used to tune one or more parameters of the simulation of that particular metrology design). Thus, in an embodiment, only specific metrology target designs and/or specific metrology recipes may be evaluated during a re-run of the simulation based on data 834. This may be accomplished using, e.g., a weight factor (such as one based on data 834 representative of reproducibility or detectability). In an embodiment, the feedback data used for consistency and/or accuracy evaluation may be general to a plurality of metrology target designs and/or metrology recipes.

In an embodiment, the tuning of the metrology target parameter or metrology recipe parameter makes a particular metrology target and/or metrology recipe more robust to variation in the process of forming or measuring the particular metrology target, to variation in the process of forming the metrology target used with the particular metrology recipe, or to variation in the process of measuring using the particular metrology recipe. For example, in an embodiment, measurements representing variation of a structure of the metrology target due to process variability (such as measurements performed of a lower periodic structure of a metrology target design without an associated upper periodic structure of a metrology target design being located over the lower periodic structure at the time of measurement) is used as, or used to derive, feedback data 834. The feedback data 834 can then represent a process variation arising in the creation of the structure of the metrology target and/or of one or more layers overlying the structure, which can then be used to arrive at a robustness of a metrology target design and/or metrology recipe to process variability. For example, feedback data 834 indicating low asymmetry indicates that the metrology target design and/or metrology recipe is robust to process variation. The feedback data 834 may, for example, represent a set of data, or function, of asymmetry against values of metrology target design pitch, measurement beam wavelength, etc. And so, the feedback data 834 may be used in the simulation to design and/or select metrology target designs and/or metrology recipes having one or more parameters that show robustness. The feedback data 834 may further represent different stages of the device manufacturing process and thus may be applied to the appropriate parts of the simulation. Thus, this feedback data 834 may be used in the simulation to identify one or more parameters which can be tuned to make a more robust metrology target design and/or metrology recipe.

In an embodiment, the simulation process 815 may be re-run responsive to feedback or feed-forward data. In an embodiment, if a difference between one or more initial or expected stack or other process conditions or expected data and respectively one or more of the measured stack or other process conditions or the measured data crosses a threshold, the simulation may be re-performed using a variation of the initial or expected stack or other process conditions (e.g., using the one or more of the measured stack or other process conditions) as well as re-performing the identifying of the one or more metrology target designs and/or metrology recipes from those simulated.

In an embodiment, when the simulation process 815 is re-run, the process may proceed from simulation process 815 onto the metrology recipe formulation at 820 and so forth. For example, this may be particularly the case where the feedback or feed-forward data would yield a changed or new metrology target design that should be measured at 825. In an embodiment, responsive to feedback or feed-forward data, the process may proceed via 819 to the evaluation process at 830. For example, this may be particularly the case where there is no changed or new metrology target design that should be measured. Data may be supplied via 819 to aid in selection of one or more metrology target designs and/or metrology recipes. For example, the data may include revised ranking of one or more metrology target designs and/or metrology recipes originally supplied via 817 and/or new values of performance parameters associated with one or more metrology target designs and/or metrology recipes originally supplied via 817. The ranking and/or revised or new values may be used at process 830 in the selection of one or more metrology target designs and/or metrology recipes.

At 835, the one or more selected metrology target designs at 830 are formed onto a plurality of substrates processed using the device manufacturing process and then measured with an inspection apparatus using their associated one or more metrology recipes for accuracy validation. This step generally corresponds to step 645. As discussed above in respect of step 645, the data collection may be a more comprehensive analysis of all, substantially all or a majority of the targets on a substrate. In an embodiment, a programmed variation to a measured or derived parameter may be introduced. For example, where the measurements relate to overlay, a known programmed overlay error may be introduced to help performance evaluation. The output 837 would be, e.g., overlay data for each of the plurality of metrology target designs. And for each metrology target design, there would be data for the plurality of recipes. In an embodiment, the data may represent measured values or parameters derived from measured values for one or more various metrology target design parameters and/or one or more various metrology recipe parameters. In an embodiment, measurements may be performed to determine variation of a structure (e.g., a periodic structure) of the metrology target due to process variability. As a non-limiting example, such measurements may be of a lower periodic structure of a metrology target design without an associated upper periodic structure of a metrology target design being located over the lower periodic structure. These measurements may represent, for example, an amount of asymmetry present in the structure and can be then be used to arrive at a robustness of a metrology target design to process variability. For example, low asymmetry can represent a robust target or target parameter. For example, a set of data may represent values of asymmetry for different combinations of wavelength and polarization for each of a plurality of metrology target designs. As another example, a set of data may represent values of asymmetry for different values of metrology target design parameter, such as pitch of a periodic structure of metrology target designs, a critical dimension of a structural feature of metrology target designs, segmentation of features of a periodic structure of metrology target designs, etc. As another example, a set of data may represent measured intensities for various metrology target design parameter or metrology recipe parameter. Additionally, the measurements may be taken at different stages of the device manufacturing process to determine which process steps are likely causing deformation of the structure.

Based on the data 837, one or more performance indicators regarding the one or more selected metrology target designs and associated one or more metrology recipes measured at 830 are calculated at 845. This step generally corresponds to step 640 and optionally step 625. For example, the data 837 is processed to determine one or more parameters regarding the performance of the metrology target designs and/or the metrology recipes such as detectability, precision, throughput and/or accuracy. In an embodiment, a parameter regarding accuracy performance is calculated in respect of the metrology target design-metrology recipe combinations. In an embodiment, the accuracy performance parameter comprises a residual between the measured data and a mathematical model used to fit the measured data. Based on the determined metrology target performance from data 837, one or more metrology target designs and associated one or more metrology recipes are manually, or by automated process, selected. In an embodiment, combinations of metrology target design and metrology recipe are ranked according to one or more performance parameters individually (which performance parameters themselves may be derived from a plurality of performance parameters, e.g., a weighted combination of performance parameters) and/or according to combinations of performance parameters (e.g., ranked separately on two or more performance parameters or ranked based on a combination of two or more performance parameters). In an embodiment, the ranking of combinations of metrology target design and metrology recipe may be presented in a user interface (e.g., a graphical user interface). In an embodiment, one or more combinations of metrology target design and metrology recipe may be automatically selected if they pass a threshold. These metrology target designs and metrology recipes may then represent the one or more metrology target design-metrology recipe combinations ready for consideration for HVM and so may be output at 860, optionally with the associated performance. In an embodiment, the user or software may select one or more candidate "point of reference" (POR) metrology target designs with, e.g., good target performance. The one or more POR metrology target designs and associated metrology recipe(s), and optionally associated performance, is output at 847.

In an embodiment, the feedback and feed-forward described above (e.g., steps 819, 827, 829, and/or 834) may be applied in association with step 845.

At 850, the one or more POR metrology target designs at 845 are formed onto a plurality of substrates processed using the device manufacturing process and then measured with a plurality of inspection apparatuses using the POR metrology target designs' associated one or more metrology recipes for inspection apparatus to inspection apparatus matching. This step generally corresponds to steps 700, 705 and 710. As noted above, this data collection would apply if, for example, multiple inspection apparatuses are used to measure metrology targets in the device manufacturing process or where a different inspection apparatus is used for development than in HVM. The data collection may be a more comprehensive analysis of all, substantially all or a majority of the targets on a substrate. The output 852 would be, e.g., overlay data for each of the plurality of metrology target designs. And for each metrology target design, there would be data for the plurality of inspection apparatuses.

Based on the data 852, an applicable correction for the respective inspection apparatus may be determined, e.g., to reduce or minimize a residual at 855. Additionally or alternatively, matching performance between inspection apparatuses is evaluated at 855. For example, one or more parameters may be derived from data 852 to evaluate matching of performance for a metrology target design—metrology recipe combination across each of the inspection apparatuses for optionally all or a plurality of layers of substrate. This step generally corresponds to steps 715, 720, 725 and 730. For example, if one or more combinations of metrology target design and metrology recipe perform better on the inspection apparatuses collectively than one or more other combinations then those combinations may be selected for HVM. Based on the determined matching performance from data 837, one or more metrology target designs and associated one or more metrology recipes may be manually, or by automated process, selected. In an embodiment, combinations of metrology target design and metrology recipe are ranked according to one or more performance parameters individually (which performance parameters themselves may be derived from a plurality of performance parameters, e.g., a weighted combination of performance parameters) and/or according to combinations of performance parameters (e.g., ranked separately on two or more performance parameters or ranked based on a combination of two or more performance parameters). In an embodiment, the ranking of combinations of metrology target design and metrology recipe may be presented in a user interface (e.g., a graphical user interface). In an embodiment, one or more combinations of metrology target design and metrology recipe may be automatically selected if they pass a threshold. The selected one or more POR metrology target design-metrology recipe combinations may then represent the one or more metrology target design-metrology recipe combinations ready for HVM and so may be output at 860, optionally with the associated performance.

So, in an embodiment, there is provided a method comprising: performing a simulation to evaluate a plurality of metrology targets and/or a plurality of metrology recipes used to measure a metrology target; identifying one or more metrology targets and/or recipes from the evaluated plurality of metrology targets and/or recipes; receiving measurement data of the one or more identified metrology targets and/or recipes; and using the measurement data to tune a metrology target parameter and/or a metrology recipe parameter, of the simulation. In an embodiment, the tuning of the metrology target parameter or metrology recipe parameter makes an identified metrology target and/or recipe more robust to variation in the process of forming or measuring the identified metrology target, to variation in the process of forming the metrology target used with the identified recipe, or to variation in the process of measuring using the identified metrology recipe. In an embodiment, the measurement data comprises a parameter representing variation of a structure of the metrology target due to process variability. In an embodiment, the parameter represents a measure of asymmetry present in the structure of the metrology target. In an embodiment, the measurement data comprises measurements at different stages of processing of the structure and/or applying of layers above the structure. In an embodiment, the method further comprises varying a property of the processing of the structure. In an embodiment, the property of the processing comprises one or more selected from: an optical property of a layer, a material thickness, a polishing parameter and/or an etching parameter. In an embodiment, the periodic structure of the metrology target is a lower periodic structure of the metrology target and the measurement data relates to the lower periodic structure without an upper periodic structure of the metrology target being located above the lower periodic structure at the time of acquisition of the measurement data. In an embodiment, the measurement data comprises measured sensitivity of a parameter of the metrology target to measurement beam wavelength. In an embodiment, the method further comprises using the measurement data to derive a parameter and using the derived parameter tune the metrology target parameter or metrology recipe parameter. In an embodiment, the derived parameter comprises one or more selected from: overlay, stack sensitivity, target coefficient, asymmetry and/or diffraction efficiency. In an embodiment, the method further comprises selecting, based on the measurement data, one or more metrology targets and/or metrology recipes from the identified one or more metrology targets and/or metrology recipes. In an embodiment, the method further comprises performing the simulation based on the tuning of the metrology target parameter or metrology recipe parameter and re-selecting, based on measurement data of one or more identified new or varied metrology targets and/or metrology recipes from the simulation and/or based on a performance parameter determined based on the tuning of the metrology target parameter or metrology recipe parameter, one or more metrology targets and/or metrology recipes from identified one or more metrology targets and/or metrology recipes. In an embodiment, the re-selecting is based on the performance parameter and the performance parameter comprises one or more selected from: overlay, stack sensitivity, target coefficient, asymmetry and/or diffraction efficiency.

In an embodiment, there is provided a method comprising: receiving measurement data of a plurality of different metrology targets, each measured at a plurality of metrology recipes; and using the measurement data to verify one or more parameters of a simulation used to evaluate a plurality of metrology targets and/or a plurality of metrology recipes used to measure a metrology target. In an embodiment, the method further comprises changing the one or more parameters based on the measurement data. In an embodiment, the one or more parameters represent one or more parameters of a process to form a metrology target. In an embodiment, the one or more parameters of a process to form a metrology target comprise one or more selected from: an optical property of a layer, a material thickness, a polishing parameter and/or an etching parameter. In an embodiment, the simulation uses the measurement data to optimize a metrology target and/or metrology recipe. In an embodiment, the measurement data comprises measured sensitivity of a parameter of the metrology target to measurement beam wavelength. In an embodiment, the method further comprises selecting, based on the measurement data, one or more metrology targets and/or metrology recipes from the evaluated one or more metrology targets and/or metrology recipes. In an embodiment, the method further comprises performing the simulation based on the changed one or more parameters and re-selecting, based on measurement data of one or more evaluated new or varied metrology targets and/or metrology recipes from the simulation and/or based on a performance parameter determined based on the changed one or more parameters, one or more metrology targets and/or metrology recipes from evaluated one or more metrology targets and/or metrology recipes. In an embodiment, re-selecting is based on the performance parameter and the performance parameter comprises one or more selected from: overlay, stack sensitivity, target coefficient, asymmetry and/or diffraction efficiency.

In an embodiment, there is provided a method comprising: simulating a plurality of metrology targets and/or a plurality of metrology recipes taking an expected process condition into account; identifying one or more metrology targets and/or recipes from the simulated plurality of metrology targets and/or recipes; receiving measurement data of the one or more identified metrology targets and/or recipes; and using the measurement data to verify the expected process condition. In an embodiment, the method further comprises, if a difference between the expected process condition or expected data and respectively a measured process condition or the measured data crosses a threshold, re-performing the simulating using a variation of the expected process condition and the identifying. In an embodiment, the simulating is done at a range of processing conditions around the expected or measured processing condition. In an embodiment, the range is defined by a user. In an embodiment, the metrology target comprises a lower target portion and comprises an upper target portion arranged in a layer between the lower target portion and an inspection apparatus configured to determine an overlay value between the upper and lower target portions. In an embodiment, receiving measurement data comprises receiving measurement data only from the lower target portion. In an embodiment, the method further comprises, if a difference between the expected process condition or expected data and respectively a measured process condition or the measured data remains within a threshold, selecting one or more metrology targets and/or recipes based on performance. In an embodiment, the performance is determined using a performance indicator comprising one or more selected from: detectability, precision, throughput, accuracy, diffraction efficiency, asymmetry and/or sensitivity to sensor artifacts. In an embodiment, the performance is a balance between several performance indicators and/or a balance between a performance indicator and an inspection apparatus tool characteristic. In an embodiment, the inspection apparatus tool characteristic comprises a parameter representing sensitivity of inspection apparatus measurements to sensor artifacts and/or straylight. In an embodiment, the process condition comprises one or more selected from: an optical property of a layer, a material thickness, a polishing parameter, an etching parameter, refractive index of a processing layer, absorption index of a processing layer, thickness of a processing layer, a variation in a layer, a characteristic of an inspection apparatus, a setting of an inspection apparatus, a measurement beam wavelength used by an inspection apparatus, a characteristic of a lithographic apparatus, and/or an alignment strategy.

In an embodiment, there is provided a method comprising: performing a simulation to evaluate a plurality of metrology targets and/or a plurality of metrology recipes used to measure a metrology target and determining a parameter representing performance of one or more of the metrology targets and/or metrology recipes; identifying one or more metrology targets and/or metrology recipes from the evaluated plurality of metrology targets and/or metrology recipes; receiving measurement data of the one or more identified metrology targets and/or metrology recipes; and selecting, based on the measurement data and the parameter, one or more metrology targets and/or metrology recipes from the identified one or more metrology targets and/or metrology recipes. In an embodiment, the method further comprises using the measurement data to tune a metrology target parameter or metrology recipe parameter, of the simulation, and performing the simulation based on the tuning of the metrology target parameter or metrology recipe parameter to determine the parameter representing performance. In an embodiment, performing the simulation based on the tuning of the metrology target parameter or metrology recipe parameter comprises evaluating one or more new or varied metrology targets and/or metrology recipes, the method further comprises receiving measurement data of the one or more new or varied metrology targets and/or metrology recipes, and the selecting comprises selecting based on the performance parameter and measurement data of the one or more new or varied metrology targets and/or metrology recipes. In an embodiment, the parameter representing performance comprises one or more selected from: overlay impact, stack sensitivity, process variation robustness, target coefficient, asymmetry and/or diffraction efficiency.

In an embodiment, there is provided a method comprising: performing a simulation to evaluate a plurality of metrology targets and a plurality of metrology recipes used to measure a metrology target; identifying one or more combinations of metrology target and metrology recipe from the evaluated plurality of metrology targets and metrology recipes; formulating a plurality of metrology recipes for the one or more metrology targets from the identified one or more combinations based on the one or more metrology recipes from the identified one or more combinations; and receiving measurement data of the one or more metrology targets from the identified one or more combinations measured using the formulated plurality of metrology recipes. In an embodiment, the method further comprises selecting, based on the measurement data, one or more metrology targets from the one or more metrology targets from the identified one or more combinations. In an embodiment, the formulated plurality of metrology recipes comprises one or more metrology recipes from the identified one or more combinations. In an embodiment, the one or more metrology recipes from the identified one or more combinations comprises a parameter and the formulated plurality of metrology recipes comprises metrology recipes having a value of the parameter within a certain range of values of the parameter of the one or more metrology recipes from the identified one or more combinations.

In an embodiment, metrology target design/metrology target recipe simulation, evaluation and/or selection may take into account diffraction efficiency (DE), or a parameter derived from diffraction efficiency, as an additional or alternative parameter (e.g., as a ranking parameter or as a calculation parameter (e.g., a multiplication factor)). The diffraction efficiency parameter represents a proportion of radiation redirected (e.g., diffracted) by the target toward the detector. Thus, the diffraction efficiency may be used, for example, to help distinguish radiation that should be measured from stray radiation in the measurement process. A higher DE can mean, e.g., a shorter integration time to arrive at a measurement. As another example, a higher DE can mean less sensitivity to inspection apparatus sensor artefacts. So, for example, metrology target designs having comparable target coefficients but a metrology target design having the target coefficient at a higher DE is favored over a metrology target design having the target coefficient at a lower DE. In an embodiment, a threshold may be associated with the diffraction efficiency parameter, e.g., a threshold above which the diffraction efficiency must exceed.

So, in an embodiment, there is provided a method comprising: evaluating a plurality of metrology targets and/or a plurality of metrology recipes used to measure a metrology target by simulation or against measured data; and identifying one or more metrology targets and/or recipes from the evaluated plurality of metrology targets and/or recipes for which diffraction efficiency, or a parameter derived from diffraction efficiency, crosses a threshold. In an embodiment, the metrology recipes comprise a measurement beam wavelength and/or measurement beam polarization.

In an embodiment, metrology target design/metrology target recipe simulation, evaluation and/or selection may take into account an inspection apparatus specific parameter, or a parameter derived from the inspection apparatus specific parameter, as an additional or alternative parameter (e.g., as a ranking parameter or as a calculation parameter (e.g., a multiplication factor)). The inspection apparatus specific parameter may be specific to an individual inspection apparatus, to a specific group of individual inspection apparatuses, or to a type of inspection apparatus. The inspection apparatus specific parameter distinguishes from generic parameters applicable to inspection (and thus generally all inspection apparatus) such as wavelength choice, polarization choice, etc. But, the inspection apparatus specific parameter may be a variability associated with one or more such generic parameters that is inspection apparatus specific. In an embodiment, the inspection apparatus specific parameter comprises a measurement beam wavelength dependency of an inspection apparatus. In an embodiment, the inspection apparatus specific property comprises a parameter representing sensitivity of inspection apparatus measurements to sensor artifacts and/or straylight. In an embodiment, the inspection apparatus specific property comprises a characteristic or sensitivity of a sensor of an inspection apparatus. In an embodiment, the inspection apparatus specific parameter comprises a parameter representing dependency of inspection apparatus artefacts or straylight on measurement beam wavelength. Such a parameter may involve a mathematical function or collection of data that represents the dependency of inspection apparatus artefacts on measurement beam wavelength. In an embodiment, the function or collection of data may be a representation of inspection apparatus sensor background noise or intensity as a function of measurement beam wavelength values. In general, an inspection apparatus may have a higher amount of sensor artefacts at a higher measurement beam wavelength. So, for example, metrology target designs having comparable stack sensitivities but a metrology target design having the stack sensitivity at a lower measurement beam wavelength is favored over a metrology target design having the stack sensitivity at a higher measurement beam wavelength. In an embodiment, a threshold may be associated with the inspection apparatus specific parameter, e.g., a threshold above which the inspection apparatus specific parameter should or must exceed or should or must remain below (e.g., where the parameter represents dependency of inspection apparatus artefacts on measurement beam wavelength, the threshold may be a measurement beam wavelength limit).

So, in an embodiment, there is provided a method comprising: evaluating a plurality of metrology targets and/or a plurality of metrology recipes used to measure a metrology target by simulation or against measured data; and identifying one or more metrology targets and/or recipes from the evaluated plurality of metrology targets and/or recipes for which a measurement apparatus property, or a parameter derived from the measurement apparatus property, crosses a threshold. In an embodiment, the measurement apparatus property comprises a measurement beam wavelength dependency of a measurement apparatus. In an embodiment, the measurement apparatus property comprises a multiplication factor associated with measurement beam wavelength dependency of a measurement apparatus. In an embodiment, the measurement apparatus property comprises a function or data representing background intensity of a measurement apparatus against measurement beam wavelength. In an embodiment, the metrology recipes comprise a measurement beam wavelength and/or measurement beam polarization. In an embodiment, the measurement apparatus property comprises a characteristic or sensitivity of a sensor of a measurement apparatus. In an embodiment, the measurement apparatus property comprises a dependency of straylight or sensor artifacts of an inspection apparatus on measurement beam wavelength.

Once the one or more metrology target designs and associated one or more metrology recipes have been selected for HVM, the metrology process is configured to enable measuring of the one or more metrology targets on substrates for monitoring and control of the device manufacturing process. This was generally described in respect of step 340. As noted above, it may be too time consuming to measure every metrology target for every substrate of every lot. Further, it is possible to model the measurement results of the metrology targets using one or more measurement data mathematical models that are appropriately parameterized (i.e., mathematical models with appropriately decided and defined parameters, and values thereof as applicable, to fit the data, e.g., to mathematically specify and model the data). So, a measurement data mathematical model and/or measurement sampling scheme may be established for measuring the one or more metrology targets.

Thus, in an embodiment, there is provided an application that based on measurements of exposed substrates determines one or more settings for substrates that are subsequently being exposed. But, measurements are inevitably uncertain (e.g., contaminated with noise) and/or are inevitably not completely fitted by a mathematical model. Further, in the flow from measurements on previous substrates to settings for the future substrates, other sources of uncertainty can be present. Further, there may be systematic variation in measured data. So, there is provided a method to account for systematic variation and uncertainty to arrive at settings that can reduce uncertainty.

Figure 9:
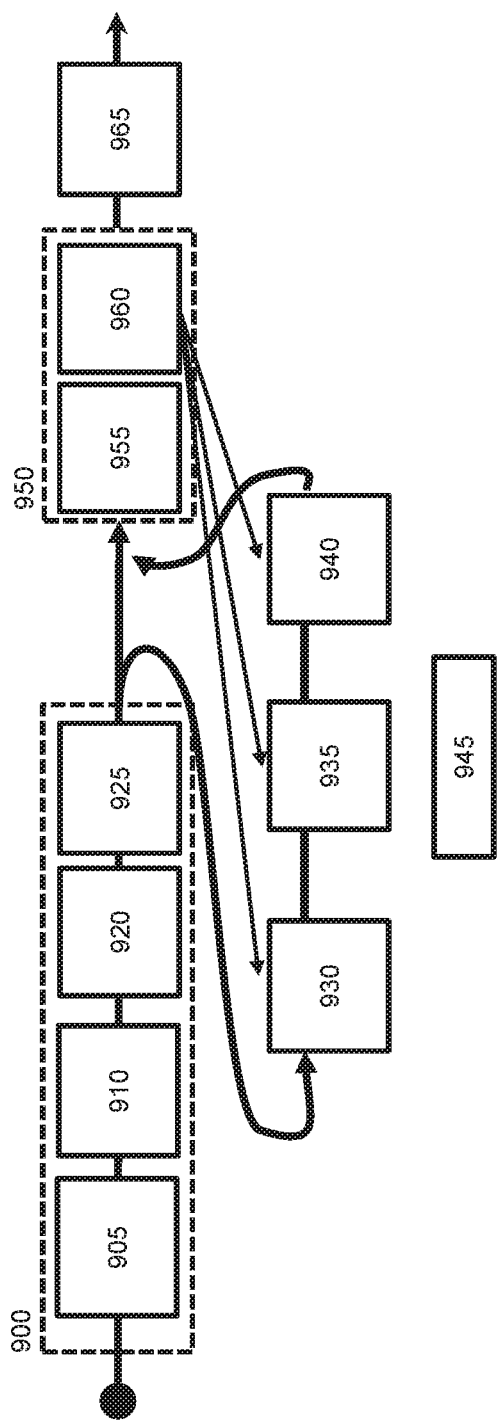
FIG. 9 schematically depicts a flow diagram of an embodiment of measurement data mathematical model and sampling scheme evaluation.

FIG. 9 schematically depicts a flow diagram of an embodiment of measurement data mathematical model and sampling scheme evaluation. The analysis in the method of FIG. 9 would typically be per layer and per device manufacturing process (including different device patterns used in a device manufacturing process). In an embodiment, the method may perform parallel processing if there are various different layers, device manufacturing processes, etc. under consideration.

At 900, various preparatory data is obtained and some optional preparatory data processing is performed. At 905, measurements results from one or more substrates (desirably a plurality of substrates) patterned with the one or more metrology target designs and measured with an inspection apparatus at their associated one or more metrology recipes is obtained or received. In an embodiment, such results are from all, nearly all, or at least the majority, of targets exposed on a substrate. In an embodiment, the measurement data is from one substrate lot, which is densely measured. Using one lot helps avoid lot to lot variation, although substrate-to-substrate variation within the lot remains. For example, in an embodiment, there may be data from more than 2000 points on each substrate of a batch of 20 or more substrates. The data may be converted into a map corresponding to the layout of the substrate. In an embodiment, the measurement data comprises one or more of: overlay data, overlay error data, alignment data, critical dimension data (e.g., critical dimension uniformity data), and/or focus data.

At 910, the measurement data from 905 may optionally be processed to back-out a correction that may have been applied in the inspection apparatus used to measure the data from 905 and/or applied in a device manufacturing process used to process the substrates corresponding to the data from 905.

At 920, one or more measurement data mathematical models are provided for consideration, which one or more measurement data mathematical models may be, for example, determined or specified for the measurement data. For example, there may be a collection of measurement data mathematical models and each measurement data mathematical model may be evaluated as discussed hereafter. The mathematical models may define a set of basis functions that fit the data once parameterized. In an embodiment, one or more measurement data mathematical models of the collection (which may be all the measurement mathematical data models in the collection) may be determined by mathematical evaluation (e.g., the "fingerprint" of the data roughly or closely matches one or more measurement data mathematical models of the collection) to be a possible fit (e.g., a relative close fit) for the data. In an embodiment, a user may specify one or more measurement data mathematical models of the collection for further consideration as discussed hereafter, whether that measurement data mathematical model was determined to be a fit or not. For example, an interface (such as a graphical user interface) may allow the user to specify the measurement mathematical data models for consideration. In an embodiment, a plurality of measurement mathematical data models are determined or specified for further evaluation as discussed hereafter, desirably as many models as feasible that fit the measurement data. In an embodiment, the mathematical model may be tuned to match the fingerprint for optimal noise suppression (e.g., eliminating redundant orders or reducing the use of higher orders).

At 925, one or more inspection apparatus throughput models are specified. In an embodiment, the inspection apparatus throughput model specifies, for example, the number of substrates measured per unit time, number of targets or points measured per unit of time or other metric representing throughput of measurement of targets on substrates. In an embodiment, the inspection throughput model may specify the location of targets on a substrate and/or distances between targets, the measurement field size, the number of points on a target to be measured, substrate and/or beam scanning speed, a loading time of a substrate in the inspection apparatus, an alignment time of the substrate in the inspection apparatus, a reposition time of the substrate in the inspection apparatus, a time for positioning a measurement target within a measurement position in the inspection apparatus, a time to retrieve the measurement data from a measurement target in the inspection apparatus, etc., which data may be used to arrive at a measurement throughput. The inspection apparatus throughput model may be a complex mathematical formula that will be permit variables to be changed as described further. In an embodiment, a user may specify a throughput threshold, e.g., a certain minimum throughput that is desired. In an embodiment, a plurality of inspection apparatus throughput models, each representing a different inspection apparatus, are specified for further evaluation as discussed hereafter. In an embodiment, the mathematical model may be configurable by a user in terms of parameters to use in the fit. For example, the user may be presented with one or more base mathematical models and can select or constrain which one or more parameters of those one or more base mathematical models are used in a fit. In an embodiment, the mathematical model may be parameterized for specific features or devices of the device manufacturing process. For example, a mathematical model may be parameterized for a specific substrate table (e.g., in a lithographic apparatus) of a plurality of substrate tables. As a further example, a mathematical model may be parameterized for a particular substrate movement direction during exposure (e.g., scan direction).

At 930, one or more sampling schemes for a metrology process are determined for further evaluation as discussed hereafter. In an embodiment, a sampling scheme may include one or more parameters selected from: number of sample points per substrate, number of substrates per lot sampled; numeric designation of the substrate(s) in a lot or per lot sampled; number of fields sampled; layout/locations of sampled fields on the substrate; number of sites in each field; locations of the sites in the field; frequency of samples; type of metrology target; or measurement algorithm.

In an embodiment, one or more sampling schemes are determined based on one or more throughput models, e.g., sampling schemes that can meet the throughput threshold. In an embodiment, one or more sampling schemes are determined based on the throughput model and the measurement mathematical data model. In an embodiment, a plurality of sampling schemes is determined based on the throughput model and/or the measurement data mathematical model. For example, the number of sampled points is restricted by the available measurement time. If, for example, the inspection apparatus is in a lithographic apparatus or otherwise in-line with the processing of substrates in a lithocell, the total available measurement time may be determined by the exposure time of a full lot. In whatever specification of available time, different combinations of number of substrates and number of points per substrate are possible. More points per substrate lead to a more detailed, but potentially noisier, description of the measured data "fingerprint." More substrates, with fewer points per substrate, lead to stronger uncertainty (e.g., noise) averaging. So, the possible combinations of number of substrates sampled and/or number of points per substrate sampled are determined via the inspection apparatus throughput model. In an embodiment, the sampling scheme(s) may be determined based on a plurality of through-put models, each for a different inspection apparatus.

In an embodiment, a sample scheme optimizer module may be used to further determine one or more aspects (e.g., layout of the sampled locations/targets) for each combination of mathematical model and number of sample points (e.g., number of substrates sampled and/or number of points per substrate sampled). For example, the sample schema optimizer may take into account various constraint or limitations, such as selecting sampling locations at a minimized distance from the edge of the substrate to avoid non-yielding dies.

In an embodiment, the sample scheme optimizer may determine a sampling scheme for measuring data with a metrology target using a metrology recipe at least partially based on the through-put model of an inspection apparatus. In an embodiment, the sampling scheme may be further based on a mathematical model. The sample scheme optimizer may further determine (e.g., calculate itself or obtain from, e.g., steps 935 and/or 940 described hereafter) an evaluation parameter based on the measurement data and the sampling scheme. For example, the evaluation parameter may comprise substrate-to-substrate variation within a lot of substrates, remaining uncertainty as discussed in more detailed hereafter, remaining systematic variation as described in more detailed hereafter, etc. The sample scheme optimizer may then determine if the evaluation parameter crosses a threshold. And, if the evaluation parameter is determined to cross the threshold, the sample scheme optimizer may change the sampling scheme at least partially based on the through-put model (e.g., modify the sampling scheme such that the sampling scheme will still meet one or more criteria of through-put model). The sample scheme optimizer may further, if the sampling scheme has been changed, re-perform at least the determining the evaluation parameter based on the measurement data and the changed sampling scheme and the determining if the evaluation parameter determined based on the measurement data and the changed sampling scheme crosses a threshold.

Fitting data using higher order basis functions typically results in increasing sensitivity to noise. On the other hand, with increasing order basis functions, the residuals will decrease. So, the sample scheme optimizer may account for this in arriving at sample scheme to match the model by balancing through a cost function that considers higher orders that reduces residuals but controls sampling to keep sensitivity to noise low. For example, the sample scheme influences the reduction of the input noise, the number of substrates that can be measured per lot influences the reduction of the noise, and/or the lot sampling influences the output noise. So, as part of the optimization, various different sample scheme variants can be used. For example, the number of substrates per lot measured may be reduced and/or the number of sampled locations per substrate may be reduced. As a further example, more measurement points may be selected near the borders of fields and/or the substrate because the basis functions may "behave" the "wildest" there and so more information is desired there.

In an embodiment, the sample scheme optimizer selects an optimal subset of measurement locations from a set of potential measurement locations. So, input to the sample scheme optimizer may be one or more mathematical models that can represent the fingerprint of the measured data and a measurement layout from which the sampling scheme may be determined (e.g., all the locations that can be measured on a substrate, e.g., where measurement targets can be or are located). From this input, the sample scheme optimizer can evaluate the one or more models and the measurement layout to arrive at one or more sampling schemes involving a subset of measurement locations (e.g., number and/or specific locations of measurements) based on a cost function. The cost function may involve reducing remaining uncertainty, obtaining uniform distribution of measurement locations, reducing clustering of measurement locations, reducing lot-to-lot variation, reducing substrate-to-substrate variation and/or obtaining fast execution time. In an embodiment, the user may further impose a constraint, e.g., number of points to be measured, excluded certain fields or intra-field points, a parameter representing the distribution of the points (e.g., more points toward the center or more points toward the edge), etc. In an embodiment, the sample scheme optimizer may impose a constraint, such as an exclusion of measurement points from non-yielding dies. Further, the sample scheme optimizer may constrain the evaluation using the through-put model, such that the one or more sample schemes meet criteria of the through-put model. The output of the sample scheme optimizer is one or more sample schemes. In an embodiment, the sample scheme optimizer may provide a graphical user interface to enable the inputs and constraints. Further, the graphical user interface may present a graphical representation of the sample scheme (e.g., a diagram or picture of a substrate with the number of measurement locations graphically depicted along with their locations). The graphical user interface can also present performance information regarding the sampling scheme such as remaining uncertainty (e.g., for different directions).

Thus, the sample scheme optimizer can optimize between a sparse sampling scheme and a dense sampling scheme based on the mathematical model, the available layout and the through-put model. The sparse sampling may have the lowest possible remaining uncertainty (and thus robust capture of the mathematical model) but may have poor coverage of the substrate and poor robustness for mismatch between the model and the fingerprint. On the other hand, the dense sampling may have large or widely varying remaining uncertainty but may have good coverage of the substrate, avoid clustering, and have good robustness for mismatch between the model and the fingerprint.

In an embodiment, as noted above, a user may specify a constraint on the sampling scheme, for example, a maximum number of samples per substrate, a maximum number of substrates per lot sampled, etc. For example, an interface (such as a graphical user interface) may allow the user to specify the constraint. In an embodiment, a user may specify one or more sampling schemes to be evaluated. For example, an interface (such as a graphical user interface) may present to a user a number of sampling schemes for selection of one or more, or all, of the sampling schemes and/or allow a user to add a sampling scheme for consideration.

In an embodiment, where a new device pattern (and thus new measurement data) is used for an otherwise same device manufacturing process and same layer, then one or more previously determined models (but parameterized for the new measurement data) and sampling schemes may be used; thus, it may not be necessary to newly determine one or more mathematical models or newly determine one or more sampling schemes.

In an embodiment, a sample scheme optimizer selects metrology point locations which are most informative to the model fitting process, given a certain model. At the same time the sampling scheme optimization algorithm attempts to position selected metrology point locations in a uniform way, such that the two objectives are balanced. In an embodiment, the sampling scheme optimization is input with a list of potential metrology point locations. Then, a sampling scheme is initialized by selecting a small number of initial selected metrology point locations. The initial selected metrology point locations should be selected according to one or more criteria in accordance with the model. In an embodiment, each of these selected metrology point locations may be selected metrology point locations positioned at the edge of the effective area of a substrate, and separated equi-angularly. The initialization step may also include defining an exclusion zone around each selected metrology point location. All metrology point locations which are outside the exclusion zones are candidate metrology point locations; i.e. "selectable" in future iterations. The exclusion zones may be circular and centered on each selected metrology point location, i.e., all metrology point locations within a certain distance of a selected metrology point location may be within an exclusion zone. Then, all candidate metrology point locations, that is all non-selected metrology point locations which are not within an exclusion zone, are evaluated. For each candidate metrology point location, it is calculated how much the informativity of the sampling scheme would improve if that metrology point location were selected. A criterion used in the evaluation may be D-optimality. The size of the initial exclusion zones should have been chosen to ensure that the initial set of candidate metrology point locations is not too large. The number of candidate metrology point locations should be a compromise between uniformity, informativity (e.g. D-optimality) of the final sampling scheme, and speed of the algorithm. After evaluating all candidate metrology point locations, the metrology point location which, according to the evaluation, contributes the most information to the sampling scheme is then added to the sampling scheme. It is determined whether the sampling scheme comprises sufficient selected metrology point locations. If it does, the sampling scheme is ready. If the sampling scheme does not have sufficient selected metrology point locations then an exclusion zone is added around the newly selected metrology point location (the other selected metrology point locations will also have exclusion zones). Then, it is determined whether there are a sufficient number of candidate metrology point locations remaining to select from, while maintaining the proper balance between informativity and uniformity. In an embodiment, if it is determined that there are too few candidate metrology point locations, this may be addressed by shrinking the exclusion zones. The exclusion zones may be shrunk for all of the selected metrology point locations comprised in the sampling scheme at that time, or for only a subset of these selected metrology point locations. Then, the determination of whether there are a sufficient number of candidate metrology point locations remaining to select from and (if necessary) the shrinking are repeated iteratively until there are a sufficient number of candidate metrology point locations from which to complete the sampling scheme. When there are a sufficient number of candidate metrology point locations, the candidate metrology point location evaluation and subsequent steps, are repeated. In an embodiment, the optimization may determine different sampling schemes for different substrates. Further, different sampling schemes of different substrates may be connected such that the selected metrology point locations are distributed with a high degree of uniformity over a plurality of substrates: for example per lot of substrates. In particular, a sampling scheme optimization method may be such that a metrology point location which has been selected for a previous sampling scheme (for a previous substrate) is not selected for a subsequent sampling scheme (for a subsequent substrate) within a lot. In this way each selected metrology point location for the lot of substrates is unique. In an embodiment, the optimization helps ensure that, for each individual substrate, the normalized model uncertainty is minimized: all parameter values can be determined with improved precision. It does this by minimizing the impact that variations in the measurements have on variations in the model predictions.

At 935, a remaining systematic variation between the measurement data at a selected sampling scheme and a selected mathematical model for fitting the measurement data is calculated. For example, the remaining systematic variation may be calculated for each sampling scheme in combination with each mathematical model.

Various kinds of systematic effects during processing of the substrates can determine the systematic variation in the output of a process and is thus reflected in the measurement results as a systematic variation (e.g., systematic overlay variation), sometimes referred to as a fingerprint of a process. Part (e.g., the statistically relevant part) of the fingerprint is described by the chosen mathematical model. But, a remainder is not captured by the mathematical model, but is still systematic. This is the remaining systematic variation. In an embodiment, the remaining systematic variation comprises a distance between an average of the measurement data over multiple substrates to the selected mathematical model. In an embodiment, the remaining system variation may take into account a statistical (sampling) precision (e.g., a 95%-90% confidence interval) of the average. The precision is useful to account for, for example, over-fitting, substrate-to-substrate variation and/or the number of substrates used. In an embodiment, the precision may be, e.g., in the range of 0.1-0.8 nm, for example about 0.5 nm.

The remaining systematic variation for certain substrates processed in a device manufacturing process may be specific to particular sub-processes or devices used in the processing of the substrates. For example, the remaining systematic variation for substrates in a device manufacturing process may be further specified as to the one or more substrate tables, one or more etch chambers, etc. used to process the substrates, since substrates may not be processed by the same substrate table, etch chamber, etc. in each iteration of the device manufacturing process and there may be variation in the systematic effects (and thus fingerprints) caused by different substrate tables, etch chambers, etc. Further, the remaining systematic variation may be specified for lots as there may be systematic effect differences from lot to lot.

In an embodiment, the remaining systematic variation comprises remaining systematic variation within a single substrate measured for monitoring a device manufacturing process or substrate-to-substrate remaining systematic variation among a plurality of substrates measured for monitoring a device manufacturing process.

At 940, a remaining uncertainty (e.g., remaining noise) of a mathematical model fitting the measurement data at the selected sampling scheme and the selected mathematical model for fitting the measurement data is calculated. For example, like the remaining systematic variation, the remaining uncertainty may be calculated for each sampling scheme in combination with each mathematical model.

Various kinds of effects during processing of the substrates (e.g., measurement noise, stochastic variations, etc.) can determine an uncertainty in the output of a process and is thus reflected in the measurement results as an uncertainty (e.g., noise). Further, the manner of taking the measurements and the mathematical modeling of the measurements can be imprecise and varying at least in part due to noise in the measurements. So, part of the process uncertainty may be described by the chosen mathematical model. But, an uncertainty remainder is not captured by the mathematical model. This remainder is remaining uncertainty. In an embodiment, the remaining uncertainty comprises an estimate of uncertainty of the selected fitted mathematical model to the measurement data. In an embodiment, the remaining uncertainty may be determined by calculating the selected mathematical model fit on sub-sampling data, per substrate (substrate pair) and determining the variation of the evaluation of the fit results over all substrates (substrate pairs) on a dense grid, e.g. the full measurement grid. In an embodiment, the part of the remaining uncertainty that originates from the within substrate uncertainty (e.g. noise) input can be computed using the noise propagation of the mathematical model and a measure of the within substrate uncertainty (e.g., noise) input.

In an embodiment, the remaining uncertainty may comprise a remaining uncertainty specified for within the substrate. In an embodiment, an estimate of the within-substrate remaining uncertainty can be determined by calculating the average substrate (e.g., per substrate table), calculating for each substrate the residual with respect to the corresponding average substrate, and then (e.g., per substrate table), take all the determined residuals as a population and calculate the 3 sigma value. To check this estimate, the 3 sigma value may be compared to a limit, optionally in different directions. For example, a good estimate may be where the 3 sigma value is less than or equal to a certain amount, e.g., 3 sigma value less than or equal 2.5 nm in x- and/or y-direction. Another check may be whether the distribution of 3 sigma values is Gaussian. Another check may be whether a plot of the stacked overlay shows little or no systematic variation/fingerprint. Another check may be whether a plot of the 3 sigma value per position across the substrate is substantially uniform. To improve the remaining uncertainty value (by removing systematic effects from the value), the data may be mathematically modelled per substrate. Then the value of an average residual substrate is subtracted from the value of individual residual substrates, rather than from the raw values of a substrate. By doing this, systematic variation can be reduced or eliminated. Similarly, within one substrate, the fields may be modeled, after which the value of an average residual field is subtracted from the value of the individual residual fields.

In an embodiment, the remaining uncertainty may comprise a model uncertainty or normalized model uncertainty. When noise is present in data, the data may be modeled in different manners depending on the nature of the noise, the measurement (e.g., sampling) scheme used, etc. So, the model uncertainty provides a measure of noise sensitivity for a mathematical model when its parameters are estimated on a given metrology scheme using noisy measurements. Thus, the model uncertainty can be interpreted as a noise amplification/suppression factor from noise present in measurements to variations in model predicted values. The model uncertainty is a function of the mathematical model used, the location of measurement points, the location where the model is evaluated (interpolation extrapolation) and the number of substrates measured. The normalized model uncertainty (NMU) is a unitless version of model uncertainty and doesn't change as a function of noise level. NMU<1 implicates noise suppression and NMU>1 implicates noise amplification. Thus, the normalized model uncertainty indicates the amount of variation in modeled values scaled with the amount of noise in the measurements. A low NMU (<1) helps ensure that a sampling scheme—mathematical model combination will lead to a consistent fit, i.e. a fit robust to noise (although it may not be a guarantee that the model will accurately describe actual measurements). In an embodiment, the maximum NMU should be less than 0.6, less than 0.5, less than 0.4, or less than 0.3 for good noise suppression. The product of the within-substrate noise (e.g., the 3 sigma value) and the NMU is the within-substrate-noise-based output noise (e.g., remaining noise). It is a theoretical output noise and is an indicator that shows the effect of the chosen model and the used sample scheme. Thus, in an embodiment, the sampling scheme optimizer may optimize to reduce or minimize NMU and then remaining uncertainty for further use in evaluation of one or more mathematical models and sampling schemes in view of the measured data may be determined by multiplying the applicable NMU values times the within-substrate noise (e.g., the 3 sigma value) of the measured data.

In an embodiment, the remaining uncertainty may comprise a substrate-to-substrate variation. This may be determined by, e.g., calculating the average 3 sigma substrate-to-substrate variation of the mathematical model across the measured data for the plurality of substrates. Calculation of the output noise resulting from within-substrate noise combined with substrate-to-substrate variation may be performed by sampling each substrate with a selected number of points. Then per substrate (or per combination of substrate and particular substrate table), a selected model is fitted to the data. The obtained model parameter values are evaluated on the complete measurement layout. Then per position on the substrate, the standard deviation is calculated. Then, the resulting standard deviations per position may be averaged over all positions.

In an embodiment, the remaining uncertainty may comprise a lot to lot variation, wherein data from multiple lots is used.

The remaining uncertainty for certain substrates processed in a device manufacturing process may be specific to particular sub-processes or devices used in the processing of the substrates. For example, the remaining uncertainty for substrates in a device manufacturing process may be further specified as to the one or more substrate tables, one or more etch chambers, etc. used to process the substrates, since substrates may not be processed by the same substrate table, etch chamber, etc. in each iteration of the device manufacturing process and there may be variation in, e.g., noise caused by different substrate tables, etch chambers, etc. Further, the remaining uncertainty may be specified for lots as there may be uncertainty differences from lot to lot.

At 945, various plotting of the results of 930, 930 and 935 may be provided. Such plotting may include preparing graphs, charts of data, maps of data over a substrate, etc.

At 950, an analysis of data is provided as well as a presentation of results and balanced advice is made. At 955, one or more mathematical models for fitting measured data and one or more measurement sampling schemes for measuring data are evaluated, with respect to one or more evaluation parameters, against measurement data across a substrate. In an embodiment, the one or more evaluation parameters comprise a parameter representing remaining uncertainty of a mathematical model fitting measured data. In an embodiment, the one or more evaluation parameters comprise a parameter representing remaining systematic variation between measured data and a mathematical model fitting measured data. In an embodiment, the one or more evaluation parameters comprise a first evaluation parameter and a second different evaluation parameter. In an embodiment, the first evaluation parameter comprises the parameter representing remaining uncertainty of a mathematical model fitting measured data and/or the second evaluation parameter comprises the parameter representing remaining systematic variation between measured data and a mathematical model fitting measured data. In an embodiment, the first evaluation parameter and the second evaluation may be combined together as a total number.

Then, one or more mathematical models and/or one or more measurement sampling schemes (of the evaluated one or more mathematical models and measurement sampling schemes) are identified for which the evaluation parameter crosses a threshold (e.g., exceeds a particular value, exceeds the value of another mathematical model and/or sampling scheme, etc.). For example, the one or more mathematical models and/or one or more measurement sampling schemes are manually, or by automated process, selected. One or more guides, restrictions, thresholds, charts and/or tables may be provided to facilitate selection of the one or more mathematical models and/or one or more measurement sampling schemes. For example, a ranking may be provided of evaluated one or more mathematical models and/or measurement sampling schemes. A manual or automated criteria may then be selection of a certain number of highest ranked mathematical models and/or measurement sampling schemes. The ranking may be based on a single performance parameter, on a combination of performance parameters, or a weighted combination of performance parameters, etc. A further manual or automated criteria may be selection of one or more mathematical models and/or one or more measurement sampling schemes passing a certain threshold value for an evaluation parameter, optionally if those one or more mathematical models and/or one or more measurement sampling schemes do or do not pass another threshold. For example, the manual or automated criteria may be evaluation of mathematical model and/or measurement sampling scheme against matching the fingerprint of the data (remaining systematic variation) in relation to noise suppression (remaining uncertainty); for example, a suitable mathematical model and/or sampling scheme may be one that has the fingerprint capture capability of the model balanced against noise suppression capability. As another example, one or more mathematical models and/or one or more measurement sampling schemes may be excluded if the remaining uncertainty is not below a certain value (e.g., excluded if NMU>0.6). As another example, one or more mathematical models and/or one or more measurement sampling schemes may be excluded if the remaining systematic variation is above a certain value (e.g., excluded if the remaining systematic variation >1-5 nm, e.g., 1 nm, 1.5 nm, 2 nm, 2.5 nm, 3 nm, 3.5 nm, 4 nm, 4.5 nm or 5 nm).

In an embodiment, the results may comprise an evaluation, for each evaluated mathematical model (e.g., a plurality of mathematical models), of an evaluation parameter against the evaluated one or more sampling schemes (e.g., a plurality of sampling schemes, such as number of points per substrate sampled). As an example, the results may be an evaluation, for each of a plurality of mathematical models, of a remaining uncertainty parameter value against a number of points per substrate sampled (or other sampling scheme). In an embodiment, those results may be graphed. In an embodiment, those results may be statistically analyzed or otherwise evaluated against a threshold to, e.g., provide advice to a user regarding the results. As an example, the results may be evaluated to identify one or more combinations of mathematical model and sampling scheme that have a maximum or minimum value (or a value within 30%, within 20%, within 15%, within 10%, or within 5%) of an evaluation parameter and optionally rank those from highest to lowest relative to the maximum or minimum value as appropriate. As a further example, the results may be evaluated to identify one or more combinations of mathematical model and sampling scheme that have a combination of good value of an evaluation parameter (e.g., high or low) in combination with a good (e.g., high) throughput value of the sampling scheme. Thus, a combination of mathematical model and sampling scheme with not the best value of an evaluation parameter may be selected because it has a better throughput. An appropriate cost function (using, e.g., weighting) can be used.

In an embodiment, the evaluated one or more sampling schemes are designed based on, or confirmed against, a through-put model of the inspection apparatus used to measure the targets. Thus, the software enables determining a sampling scheme and/or a mathematical model to monitor a process step in a lithographic process by determining the sampling scheme and the mathematical model at least partially based on a through-put model of an inspection apparatus. So, in the case of the example presented above regarding results of an evaluation, for each of a plurality of mathematical models, of a remaining uncertainty parameter value against a number of points per substrate sampled (or other sampling scheme), the software may identify or evaluate those particular specific numbers of points per substrate (or other specific sampling schemes) that will satisfy the throughput-model of the inspection apparatus. Thus, the user may be presented with specific combinations of mathematical model and sampling that satisfy a through-put model and moreover, presented with those specific combinations, or information regarding selecting specific combinations, that obtain an optimal performance for certain characteristics (such as good matching a fingerprint of the data with good noise suppression).

In an embodiment of balanced advice, a measure of the statistical precision of the average substrate (i.e. used as input for determining the remaining systematic variation) is used with a warning limit to help the user identify a potential issue with the metrology target/metrology recipe/sampling scheme/mathematical model.

In a further embodiment of balanced advice, one or more KPIs for substrate-to-substrate variation across the substrate are used with a warning limit to help the user identify a potential issue with the metrology target/metrology recipe/sampling scheme/mathematical model. For example, the software may suggest to a user to implement an edge exclusion for the sampling scheme (i.e., prevent sampling of an area near the edge of the substrate, where the KPI used to identify this issue may be a maximum of substrate-to-substrate standard deviation across the substrate), to indicate a potential benefit of a substrate level correction (where the KPI used to identify this issue may be spread of standard deviation across the substrate) or to identify a potential issue with the overall noise level of the measured data (where the KPI used to identify this issue may be mean of the standard deviation across the substrate).

At 960, the user may be provided a guide on key performance indicators (KPIs). In an embodiment, a key performance indicator and/or a limit for a key performance indicator for the evaluation can be determined. For example, one or more KPIs may be identified and one or more thresholds associated with the KPIs may be determined to enable process control. For example, mean, standard deviation, variation, etc. may be identified as KPIs and thresholds (e.g., value not to exceed, value not to go below, etc.) may be determined to enable control of the process. The software may analyze various KPIs to identify one or more selected KPIs that are statistically meaningful to the applicable mathematical model/sampling scheme combination in view of, e.g., the measured data or a simulation. Similarly, the software may analyze the one or more selected KPIs against, e.g., the measured data or a simulation, to identify one or more statistically meaningful thresholds for the one or more selected KPIs. For example, the software may identify mean overlay as a meaningful KPI for a particular overlay metrology target/recipe/model/sampling scheme combination and further identify a maximum value associated with that KPI for use during process control. So, if, for example, overlay in a device manufacturing process using the particular overlay metrology target/recipe/model/sampling scheme combination excursions above the maximum value of the mean overlay KPI, the control of the device manufacturing process can take appropriate action, such as reworking, determine and/or apply a change to the device manufacturing process (e.g., change a lithographic apparatus parameter, change an etch parameter, etc.), stop a device manufacturing process, etc.

Further, in an embodiment, at 960, the user may be able to drill down into the measured data and into data (measured or derived data) associated with the one or more mathematical models, the one or more sampling schemes, the one or more metrology target designs, the one or more metrology recipes and/or one or more KPIs. For example, a graphical user interface of the software may present a user the results as described above and those results may have one or more links to view, e.g., details of the measured data (e.g., a diagram or picture of a substrate showing the distribution of, for example, overlay results), details of the sampling scheme (e.g., a diagram or picture of a substrate showing the locations of sampling points at fields and/or of one or more fields showing intra-field locations), details of the mathematical model (e.g., the type of model, basis functions, parameter values, etc.), details of one or more KPIs (e.g., values for different directions, etc.). The drill down data may be presented on a different screen, as an overlapping window, etc. In an embodiment, a user may select a KPI for review and/or set a user-defined threshold on a KPI and drill-down on the data (e.g., measured data, sampling scheme, mathematical model, etc.) using the KPI and/or user-defined threshold.

At 965, the one or more metrology target design—metrology recipe combinations ready for consideration for HVM may be output, optionally with the associated performance. Further, the one or more associated mathematical models and one or more associated sampling schemes may be output, optionally with the associated performance.

Figure 10:
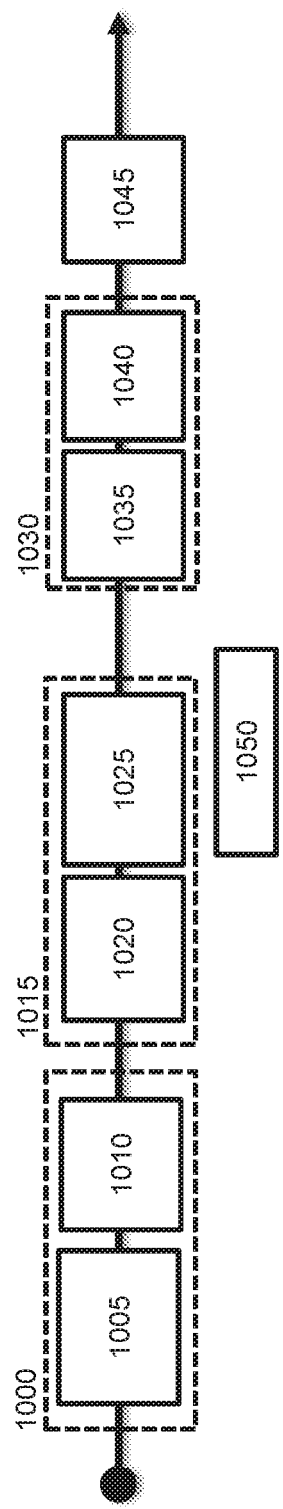
FIG. 10 schematically depicts a flow diagram of an embodiment of a method of verifying expected performance.

Once the one or more mathematical models and/or one or more sampling schemes have been determined for the selected one or more metrology targets and associated one or more metrology recipes, it may be desirable to verify their expected dynamic performance before implementation into HVM. FIG. 10 schematically depicts a flow diagram of an embodiment of a method of verifying expected performance.

At 1000, various preparatory data is obtained and some optional preparatory data processing is performed. At 1005, measurements results from one or more substrates (desirably a plurality of substrates) patterned with the one or more metrology target designs and measured with an inspection apparatus at their associated one or more metrology recipes and sampled at the associated one or more sampling schemes is obtained or received. In an embodiment, the measurement data is from a plurality of lots of substrates. For example, in an embodiment, a sampling scheme may be 200 points per substrate for 6 substrates of a lot and there may be data from 20 or more lots. Thus, there is obtained measured across-substrate measurement data for a plurality of substrates of each lot of a plurality of lots. The data may be converted into a map corresponding to the layout of the substrate. In an embodiment, the measurement data comprises one or more of: overlay data, overlay error data, alignment data, critical dimension data, focus data and/or critical dimension uniformity data.

At 1010, the measurement data from 1005 may optionally be processed to back-out a correction that may have been applied in the inspection apparatus used to measure the data from 1005 and/or applied in a device manufacturing process used to process the substrates corresponding to the data from 1005.

At 1015, data processing is performed including, for example, simulation. At 1020, the software may determine a correction based on data derived from the measured data for a particular subset of lots of the plurality of lots. The correction may be an estimated correction. In an embodiment, the correction comprises a change of parameter of a lithographic apparatus used to expose the substrates. The correction may be determined using the one or more mathematical models associated with the selected one or more sampling schemes, one or more metrology targets and one or more metrology recipes. In an embodiment, the software evaluates the measurement data for the plurality of substrates of the particular lot to obtain values of parameters of the one or more mathematical models for the measurement data, wherein the data derived from the measured data comprises the values of the parameters. In an embodiment, the correction may be derived using a simulation that simulates the device manufacturing and measuring process, e.g., an image/resist simulation model for lithography along with a substrate processing simulation model for development, etch, etc. and a simulation model for measuring a metrology target on the simulated substrate.

At 1025, the software performs a simulation, which applies the correction, to obtain simulated measurement data for a set of subsequent lots. In an embodiment, the simulation simulates the device manufacturing and measuring process, e.g., an image/resist simulation model for lithography along with a substrate processing simulation model for development, etch, etc. and a simulation model for measuring a metrology target on the simulated substrate. The simulated measurement data for the set of subsequent lots may be compared against the measured data for the set of subsequent lots.

At 1050, various plotting of the results of 1020 and 1025 may be provided. Such plotting may include preparing graphs, charts of data, maps of data over a substrate, etc.

At 1030, an analysis of data is provided as well as a presentation of results and advice is made. At 1035, results are presented through, e.g., a user interface. The results may be, for example, a graph depicting, for each of the measured metrology target/recipe/model/sampling scheme combination and the simulated metrology target/recipe/model/sampling scheme combination, results for a parameter (such as overlay) for each of the lots. There may be provided a graph for two different directions, e.g., X and Y directions. The graph(s) will give a user a representation of how well predicted performance of the metrology target/recipe/model/sampling scheme combination from, for example, 965 matches with measured data for the metrology target/recipe/model/sampling scheme combination.

At 1040, the user may be provided a guide on key performance indicators (KPIs). In an embodiment, a key performance indicator and/or a limit for a key performance indicator for the evaluation of the simulated measurement data against the measured data may be determined and/or a key performance indicator and/or a limit for a key performance indicator for the evaluation of the process may be determined. For example, one or more KPIs may be identified and one or more thresholds associated with the KPIs may be determined to enable verification between the measured and simulated results. For example, mean, standard deviation, variation, etc. may be identified as KPIs and thresholds (e.g., value not to exceed, value not to go below, etc.) may be determined to enable verification of the metrology target/recipe/model/sampling scheme combination. For example, if the mean and/or standard deviation values for the measured and simulated results are not within a certain amount of each other, the determination of a metrology target/recipe/model/sampling scheme combination may need to be re-performed with different parameters, different parameter values, etc.

Additionally or alternatively, for example, one or more KPIs may be identified and one or more thresholds associated with the KPIs may be determined to enable process control. For example, mean, standard deviation, variation, etc. may be identified as KPIs and thresholds (e.g., value not to exceed, value not to go below, etc.) may be determined to enable control of the process. The software may analyze various KPIs to identify one or more selected KPIs that are statistically meaningful to the metrology target/recipe/model/sampling scheme combination in view of, e.g., the measured data or a simulation. Similarly, the software may analyze the one or more selected KPIs against, e.g., the measured data or a simulation, to identify one or more statistically meaningful thresholds for the one or more selected KPIs. For example, the software may identify mean overlay as a meaningful KPI for a particular overlay metrology target/recipe/model/sampling scheme combination and further identify a maximum value associated with that KPI for use during process control. So, if, for example, overlay in a device manufacturing process using the particular overlay metrology target/recipe/model/sampling scheme combination excursions above the maximum value of the mean overlay KPI, the control of the device manufacturing process can take appropriate action, such as reworking, determine and/or apply a change to the device manufacturing process (e.g., change a lithographic apparatus parameter, change an etch parameter, etc.), stop a device manufacturing process, etc.

At 1045, the user or software may select one or more metrology target/recipe/model/sampling scheme combinations based on KPIs and their thresholds, e.g., those combinations with good target performance. The one or more metrology target design-metrology recipe combinations ready for consideration for HVM may be output, optionally with the associated performance. Further, the one or more associated mathematical models and one or more associated sampling schemes may be output, optionally with the associated performance.

In an embodiment, there is provided a method comprising: evaluating, with respect to a parameter representing remaining uncertainty of a mathematical model fitting measured data, one or more mathematical models for fitting measured data and one or more measurement sampling schemes for measuring data, against measurement data across a substrate; and identifying one or more mathematical models and/or one or more measurement sampling schemes, for which the parameter crosses a threshold.

In an embodiment, the method further comprises evaluating the one or more mathematical models and one or more measurement sampling schemes with respect to remaining systematic variation between measured data and a mathematical model fitting measured data. In an embodiment, remaining systematic variation comprises a distance between an average of measured data over multiple substrates to the mathematical model. In an embodiment, the remaining systematic variation further accounts for a statistical precision of the average. In an embodiment, remaining uncertainty comprises an estimate of uncertainty of the fitted mathematical model to the measured data. In an embodiment, the identifying comprising providing a ranking of evaluated one or more mathematical models for fitting measured data and/or evaluated one or more measurement sampling schemes. In an embodiment, the measurement data comprises one or more of: overlay data, overlay error data, alignment data, critical dimension data, focus data and/or critical dimension uniformity data. In an embodiment, the method further comprises enabling a user to select a plurality of mathematical models and/or a plurality of sampling schemes for evaluation. In an embodiment, the sampling scheme comprises one or more selected from: number of sample points per substrate, layout of sample points, and/or number of substrates per lot. In an embodiment, the method further comprises: receiving measured across-substrate measurement data for a plurality of substrates of each lot of a plurality of lots, where the measurement data is modeled with the identified one or more mathematical models and/or measured with the identified one or more measurement sampling schemes; performing a simulation that involves applying a correction, based on data derived from the measured data for a particular subset of lots of the plurality of lots, to obtain simulated measurement data for a set of subsequent lots; and evaluating the simulated measurement data for the set of subsequent lots against the measured data for the set of subsequent lots. In an embodiment, the measurement data is obtained using a particular measurement recipe and a particular measurement sampling scheme and the correction is determined and/or the simulation is performed using a particular mathematical model for the measurement data. In an embodiment, the method further comprises evaluating the measurement data for the plurality of substrates of the particular lot to obtain values of parameters of a mathematical model for the measurement data, wherein the data derived from the measured data comprises the values of the parameters. In an embodiment, the correction comprises a change of parameter of a lithographic apparatus used to expose the substrates. In an embodiment, the method further comprises determining a key performance indicator and/or a limit for a key performance indicator for the evaluation of the simulated measurement data against the measured data.

In an embodiment, there is provided a method comprising: evaluating, with respect to a first evaluation parameter and a second different evaluation parameter, one or more mathematical models for fitting measured data and one or more measurement sampling schemes for measuring data, against measurement data across a substrate; and identifying one or more mathematical models and/or one or more measurement sampling schemes, for which the first and second evaluation parameters cross a threshold.

In an embodiment, the first or second evaluation parameter comprises remaining systematic variation between measured data and a mathematical model for fitting the measured data. In an embodiment, the first or second evaluation parameter comprises a parameter representing remaining uncertainty of a mathematical model fitting measured data. In an embodiment, the identifying comprising providing a ranking of evaluated one or more mathematical models for fitting measured data and/or evaluated one or more measurement sampling schemes. In an embodiment, the measurement data comprises one or more of: overlay data, overlay error data, alignment data, critical dimension data, focus data and/or critical dimension uniformity data. In an embodiment, the method further comprises enabling a user to select a plurality of mathematical models and/or a constraint on a sampling scheme for evaluation. In an embodiment, the sampling scheme comprises one or more selected from: number of sample points per substrate, layout of sample points, and/or number of substrates per lot. In an embodiment, the method further comprises: receiving measured across-substrate measurement data for a plurality of substrates of each lot of a plurality of lots, where the measurement data is modeled with the identified one or more mathematical models and/or measured with the identified one or more measurement sampling schemes; performing a simulation that involves applying a correction, based on data derived from the measured data for a particular subset of lots of the plurality of lots, to obtain simulated measurement data for a set of subsequent lots; and evaluating the simulated measurement data for the set of subsequent lots against the measured data for the set of subsequent lots. In an embodiment, the measurement data is obtained using a particular measurement recipe and a particular measurement sampling scheme and the correction is determined and/or the simulation is performed using a particular mathematical model for the measurement data. In an embodiment, the method further comprises evaluating the measurement data for the plurality of substrates of the particular lot to obtain values of parameters of a mathematical model for the measurement data, wherein the data derived from the measured data comprises the values of the parameters. In an embodiment, the correction comprises a change of parameter of a lithographic apparatus used to expose the substrates. In an embodiment, the method further comprises determining a key performance indicator and/or a limit for a key performance indicator for the evaluation of the simulated measurement data against the measured data.

In an embodiment, there is provided a method of determining a sampling scheme for measuring data and/or a mathematical model for fitting measured data, to monitor a process step in a lithographic process, the method comprising: determining the sampling scheme and the mathematical model at least partially based on a through-put model of an inspection apparatus.

In an embodiment, the through-put model specifies a loading time of a substrate in the inspection apparatus, an alignment time of the substrate in the inspection apparatus, a reposition time of the substrate in the inspection apparatus, a time for positioning a measurement target within a measurement position in the inspection apparatus and/or a time to retrieve the measurement data from a measurement target in the inspection apparatus. In an embodiment, the determining comprises determining based on a plurality of through-put models, each for a different inspection apparatus. In an embodiment, the determining further comprises determining based on remaining systematic variation between measured data and a mathematical model for fitting the measured data. In an embodiment, the determining further comprises determining based on a parameter representing remaining uncertainty of a mathematical model fitting measured data. In an embodiment, the remaining systematic variation or remaining uncertainty comprises remaining systematic variation or remaining uncertainty respectively within a single substrate measured for monitoring the process step or substrate-to-substrate remaining systematic variation or remaining uncertainty among a plurality of substrates measured for monitoring the process step. In an embodiment, the inspection apparatus is an inspection apparatus in a lithographic apparatus. In an embodiment, the sampling scheme comprises one or more selected from: number of sample points per substrate, layout of sample points, and/or number of substrates per lot.

In an embodiment, there is provided a method comprising: receiving measurement data of a metrology target measured according to a metrology recipe; determining a sampling scheme for measuring data with the metrology target using the metrology recipe at least partially based on a through-put model of an inspection apparatus; determining an evaluation parameter based on the measurement data and the sampling scheme; determining if the evaluation parameter crosses a threshold; and changing the sampling scheme at least partially based on the through-put model if the evaluation parameter is determined to cross the threshold.

In an embodiment, the evaluation parameter comprises substrate-to-substrate variation within a lot of substrates. In an embodiment, the method further comprises determining a mathematical model for fitting the measurement data and wherein the determining the sampling scheme is further based on the mathematical model. In an embodiment, the method further comprises, if the sampling scheme has been changed, re-performing at least the determining the evaluation parameter based on the measurement data and the changed sampling scheme and the determining if the evaluation parameter determined based on the measurement data and the changed sampling scheme crosses a threshold. In an embodiment, the determining the sampling scheme comprises determining based on a plurality of through-put models, each for a different inspection apparatus. In an embodiment, the method further comprises determining the sampling scheme and/or a mathematical model for fitting measured data based on remaining systematic variation between measured data and a mathematical model for fitting the measured data. In an embodiment, the method further comprises determining the sampling scheme and/or a mathematical model for fitting measured data based on a parameter representing remaining uncertainty of a mathematical model fitting measured data. In an embodiment, the sampling scheme comprises one or more selected from: number of sample points per substrate, layout of sample points, and/or number of substrates per lot. In an embodiment, the through-put model specifies a loading time of a substrate in the inspection apparatus, an alignment time of the substrate in the inspection apparatus, a reposition time of the substrate in the inspection apparatus, a time for positioning a measurement target within a measurement position in the inspection apparatus and/or a time to retrieve the measurement data from a measurement target in the inspection apparatus. In an embodiment, the metrology target comprises an alignment target.

Figure 11:
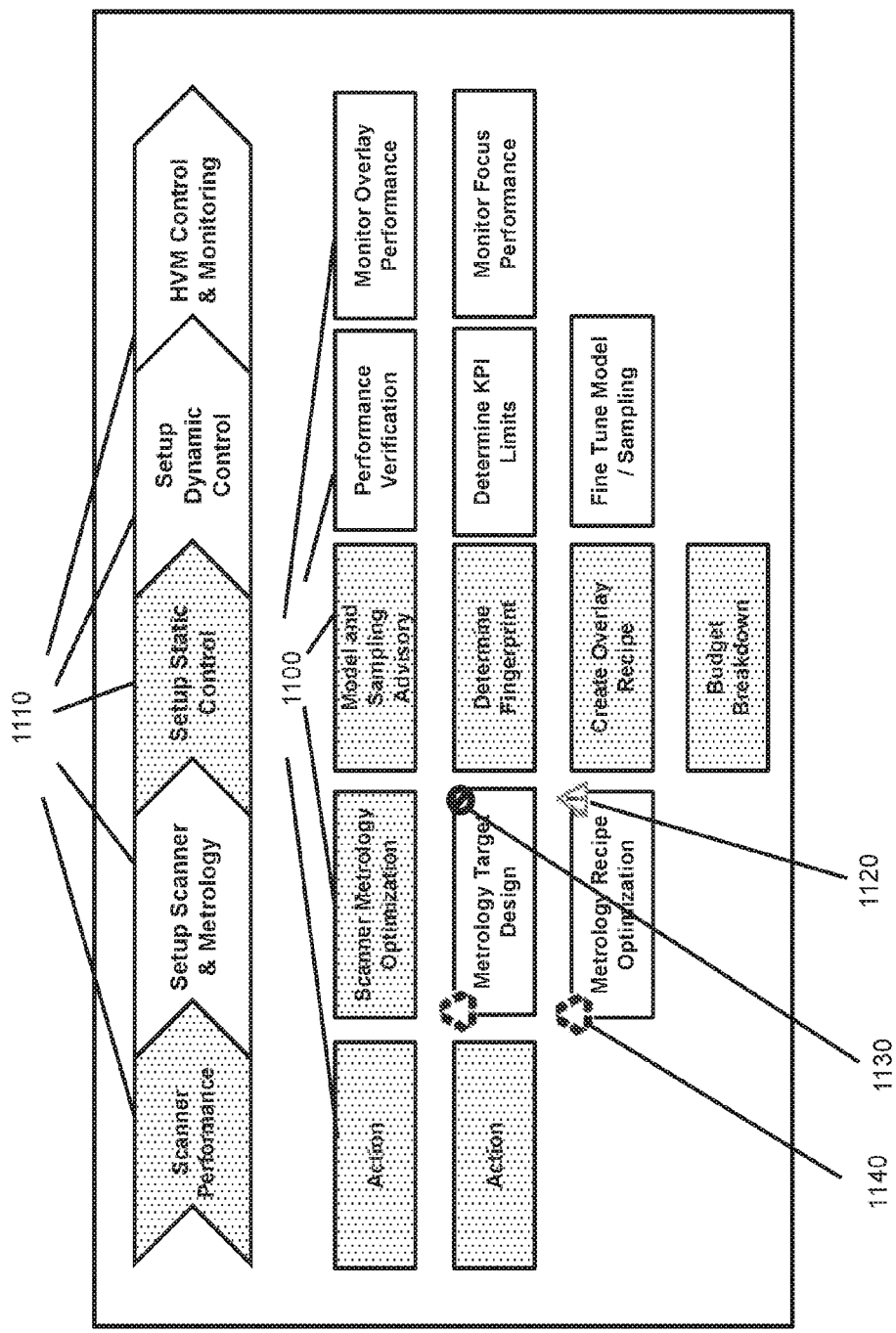
FIG. 11 schematically depicts a user interface of software to provide for an embodiment of part of device manufacturing process development, monitoring and control.

FIG. 11 schematically depicts a user interface of software to provide for an embodiment of part of device manufacturing process development, monitoring and control. The embodiment of FIG. 11 is a graphical user interface of software designed for a measurement design, setup and/or monitoring process, such as described above. In an embodiment, the concepts of FIG. 11 may be extended to software that enables other parts of device manufacturing process development, monitoring and control.

Referring to FIG. 11, there is depicted a plurality of graphical user interface elements 1100. Each graphical user interface element 1100 represents a step in a measurement design, setup and/or monitoring process and each graphical user interface element enables access by the user to further steps in the measurement design, setup and/or monitoring process for the associated step of the graphical user interface element. For example, clicking on a graphical user interface element enables a user to access further steps associated with the description of the graphical user elements. The additional steps may appear on a further screen (not depicted here for clarity).

A set of one or more graphical user interface elements 1100, e.g., a column of one or more graphical user interface elements 1100 as shown in FIG. 11, may be associated with a particular function represented by an associated graphical user interface element 1110. The graphical user element 1110 itself may enable access by the user to further steps in the measurement design, setup and/or monitoring process for the associated function of the graphical user interface element. In an embodiment, one or more of the graphical user interface elements 1110 may not enable access to further steps and may merely provide information regarding the particular function and the one or more steps represented by the associated one or more graphical user interface elements 1100, e.g., the associated column of one or more graphical user interface elements 1100 as shown in FIG. 11.

Further, there may be displayed an indicator associated with one or more of the plurality of graphical user elements 1100, 1110. In an embodiment, the indicator indicates that a step in the measurement design, setup and/or monitoring process is not completed and/or that a key performance indicator associated with a step in the measurement design, setup and/or monitoring process has passed a threshold. In an embodiment, the indicator comprises a color of the graphical user interface element and/or a symbol associated with the graphical user interface element. For example, indicator 1130 (e.g., a stop sign or similar symbol) can indicate that a step in the measurement design, setup and/or monitoring process is not completed and/or that a key performance indicator associated with a step in the measurement design, setup and/or monitoring process does not successfully meet a criteria. For example, indicator 1120 (e.g., an alert sign, an exclamation sign or other similar symbol) can indicate that a key performance indicator associated with a step in the measurement design, setup and/or monitoring process has passed a threshold. Additionally or alternatively, one or more of the plurality of graphical user elements 1100, 1110 may be provided different colors, shading or texture depending on particular statuses. For example, the graphical user elements 1100, 1110 with a dotted fill indicate that, e.g., the step or function has been completed or is otherwise OK. The dotted fill represents, for example, a green color, a particular shading and/or a particular texture. Thus, the dotted fill represents, for example, that a step in the measurement design, setup and/or monitoring process is completed and/or that a key performance indicator associated with a step in the measurement design, setup and/or monitoring process successfully meets a criteria. As another example, the graphical user elements 1100, 1110 with a hatched fill indicate that, e.g., the step or function has not been completed or is otherwise not OK. The hatched fill represents, for example, a red or orange color, a particular shading and/or a particular texture. Thus, the hatched fill represents, for example, that a step in the measurement design, setup and/or monitoring process has not been completed and/or that a key performance indicator associated with a step in the measurement design, setup and/or monitoring process does not successfully meet a criteria. As another example, the graphical user elements 1100, 1110 with no fill indicate that, e.g., the step or function has not been started or cannot be accessed. The no fill represents, for example, a white color, a particular shading and/or a particular texture. Thus, the no fill represents, for example, that a step in the measurement design, setup and/or monitoring process in the step or function represented by the graphical user interface element has not been attempted or cannot be attempted because, e.g., one or more earlier or dependent steps have not been completed or attempted and/or a key performance indicator associated with an earlier or dependent step in the measurement design, setup and/or monitoring process does not successfully meet a criteria.

In an embodiment, the software, despite a user engaging a particular graphical user interface element, prevents access by the user to the further steps in the measurement design, setup and/or monitoring process for the associated step of the particular graphical user interface element. For example, access may be prevented to one or more of the graphical user elements with no fill until one or more steps associated with, e.g., a graphical user interface element having the hatched fill or an indicator 1120 or 1130, are completed.

In an embodiment, one or more of the graphical user interface elements or indicators may represent, or display or enable display of information regarding, a key performance indicator and/or a guideline. For example, one or more graphical user interface elements 1100 or indicators 1120 or 1130 may represent a key performance indicator and/or a guideline, such that the graphical user interface element enables access to a key performance indicator and/or guideline by, e.g., the user clicking on the graphical user interface element. In an embodiment, one or more graphical user interface elements 1100 or indicators 1120 or 1130 may display or enable display of information regarding a key performance indicator and/or a guideline. For example, one or more graphical user interface elements 1100 or indicators 1120 or 1130 may display a value of a key performance indicator or signal whether a key performance indicator is OK or not OK. In an embodiment, the user may "fly-over" one or more graphical user interface elements 1100 or indicators 1120 or 1130 using, for example, a pointer icon, to display information regarding a key performance indicator (e.g., a value of a key performance indicator or signal whether a key performance indicator is OK or not OK) and/or a guideline.

In an embodiment, one or more of the graphical user interface elements may have an indicator 1140 to allow updating or refreshing of data. The user may click or otherwise engage the indicator 1140 to cause data associated with one or more steps associated with the graphical user interface to update or refresh, which may cause a change in access to steps associated with one or more other graphical user interface elements and/or a change in indicator 1120 or 1130.

In an embodiment, there is provided a method comprising: displaying a plurality of graphical user interface elements, each graphical user interface element representing a step in a measurement design, setup and/or monitoring process and each graphical user interface element enabling access by the user to further steps in the measurement design, setup and/or monitoring process for the associated step of the graphical user interface element; and displaying an indicator associated with one or more of the plurality of graphical user elements, the indicator indicating that a step in the measurement design, setup and/or monitoring process is not completed and/or that a key performance indicator associated with a step in the measurement design, setup and/or monitoring process has passed a threshold.

In an embodiment, the method further comprises, despite a user engaging a particular graphical user interface element, preventing access by the user to the further steps in the measurement design, setup and/or monitoring process for the associated step of the particular graphical user interface element. In an embodiment, the indicator comprises a color of the graphical user interface element and/or a symbol associated with the graphical user interface element. In an embodiment, the method further comprises displaying a graphical user interface element or indicator that represents, or displays or enables display of information regarding, a key performance indicator and/or a guideline.

An embodiment of the invention may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs. Although specific reference may be made in this text to the use of inspection apparatus in the manufacture of ICs, it should be understood that the inspection apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

References herein to crossing or passing a threshold may include something having a value lower than a specific value or lower than or equal to a specific value, something having a value higher than a specific value or higher than or equal to a specific value, something being ranked higher or lower than something else (through e.g., sorting) based on, e.g., a parameter, etc.

The term "optimizing" and "optimization" as used herein refers to or means adjusting a lithographic apparatus, a device manufacturing process, etc. such that results and/or processes of lithography or device manufacturing have more desirable characteristics, such as higher accuracy of projection of a design layout on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

In an optimization process of a system, a figure of merit of the system or process can be represented as a cost function. The optimization process boils down to a process of finding a set of parameters (design variables) of the system or process that optimizes (e.g., minimizes or maximizes) the cost function. The cost function can have any suitable form depending on the goal of the optimization. For example, the cost function can be weighted root mean square (RMS) of deviations of certain characteristics (evaluation points) of the system or process with respect to the intended values (e.g., ideal values) of these characteristics; the cost function can also be the maximum of these deviations (i.e., worst deviation). The term "evaluation points" herein should be interpreted broadly to include any characteristics of the system or process. The design variables of the system can be confined to finite ranges and/or be interdependent due to practicalities of implementations of the system or process. In the case of a lithographic apparatus or device manufacturing process, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

The invention may further be described using the following clauses:

1. A method comprising:
   displaying a plurality of graphical user interface elements, each graphical user interface element representing a step in a measurement design, setup and/or monitoring process and each graphical user interface element enabling access by the user to further steps in the measurement design, setup and/or monitoring process for the associated step of the graphical user interface element; and displaying an indicator associated with one or more of the plurality of graphical user elements, the indicator indicating that a step in the measurement design, setup and/or monitoring process is not completed and/or that a key performance indicator associated with a step in the measurement design, setup and/or monitoring process has passed a threshold.
2. The method of clause 1, further comprising, despite a user engaging a particular graphical user interface element, preventing access by the user to the further steps in the measurement design, setup and/or monitoring process for the associated step of the particular graphical user interface element.
3. The method of clause 1 or clause 2, wherein the indicator comprises a color of the graphical user interface element and/or a symbol associated with the graphical user interface element.
4. The method of any of clauses 1 to 3, further comprising displaying a graphical user interface element or indicator that represents, or displays or enables display of information regarding, a key performance indicator and/or a guideline.
5. A non-transitory computer program product comprising machine-readable instructions for causing a processor to cause performance of the method of any of clauses 1 to 4.
6. A system comprising:
an inspection apparatus configured to provide a beam on a measurement target on a substrate and to detect radiation redirected by the target to determine a parameter of a lithographic process; and
the non-transitory computer program product of clause 5.
7. The system of clause 6, further comprising a lithographic apparatus comprising a support structure configured to hold a patterning device to modulate a radiation beam and a projection optical system arranged to project the modulated onto a radiation-sensitive substrate.
8. A system comprising:
an alignment sensor, comprising:
   an output to provide radiation from a radiation source onto a target,
a detector configured to receive radiation from the target, and
a control system configured to determine alignment of two or more objects responsive to the received radiation; and
the non-transitory computer program product of clause 5.
9. The system of clause 8, further comprising a lithographic apparatus comprising a support structure configured to hold a patterning device to modulate a radiation beam and a projection optical system arranged to project the modulated onto a radiation-sensitive substrate.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method comprising:
   displaying a plurality of graphical user interface elements, each graphical user interface element representing a step in a measurement design, setup and/or monitoring process and each graphical user interface element enabling access by the user to further steps in the measurement design, setup and/or monitoring process for the associated step of the graphical user interface element; and
   displaying an indicator associated with one or more of the plurality of graphical user elements, the indicator indicating that a step in the measurement design, setup and/or monitoring process is not completed and/or that a key performance indicator associated with a step in the measurement design, setup and/or monitoring process has passed a threshold.

2. The method of claim 1, further comprising, despite a user engaging a particular graphical user interface element, preventing access by the user to the further steps in the measurement design, setup and/or monitoring process for the associated step of the particular graphical user interface element.

3. The method of claim 1, wherein the indicator comprises a color of the graphical user interface element and/or a symbol associated with the graphical user interface element.

4. The method of claim 1, further comprising displaying a graphical user interface element or indicator that represents, or displays or enables display of information regarding, a key performance indicator and/or a guideline.

5. The method of claim 1, wherein at least three types of indicator are used, a first displayed indicator indicating that the step in the measurement design, setup and/or monitoring process is not completed and/or that a key performance indicator associated with a step in the measurement design, setup and/or monitoring process has passed a threshold, a second displayed indicator indicating that the step in the measurement design, setup and/or monitoring process is completed and/or that a key performance indicator associated with a step in the measurement design, setup and/or monitoring process has not passed the threshold, and a third displayed indicator indicating that the step in the measurement design, setup and/or monitoring process has not been started.

6. The method of claim 1, comprising displaying an icon, as the indicator, at least partly overlaying the one or more of the plurality of graphical user elements.

7. The method of claim 1, comprising displaying at least one graphical user interface element regarding the physical design of a metrology target, the at least one graphical user interface element enabling access by the user to one or more steps to configure one or more geometric parameters of the metrology target.

8. The method of claim 1, wherein the indicator displays, or displays upon user flyover, of a value of key performance indicator of the measurement design, setup and/or monitoring process.

9. A non-transitory computer program product comprising machine-readable instructions for causing a processor system to cause:
   display of a plurality of graphical user interface elements, each graphical user interface element representing a step in a measurement design, setup and/or monitoring process and each graphical user interface element enabling access by the user to further steps in the measurement design, setup and/or monitoring process for the associated step of the graphical user interface element; and
   display of an indicator associated with one or more of the plurality of graphical user elements, the indicator indicating that a step in the measurement design, setup and/or monitoring process is not completed and/or that a key performance indicator associated with a step in the measurement design, setup and/or monitoring process has passed a threshold.

10. A system comprising:
   an inspection apparatus configured to provide a beam on a measurement target on a substrate and to detect radiation redirected by the target to determine a parameter of a lithographic process; and
   the non-transitory computer program product of claim 9.

11. The system of claim 10, further comprising a lithographic apparatus comprising a support structure configured to hold a patterning device to modulate a radiation beam and a projection optical system arranged to project the modulated radiation beam onto a radiation-sensitive substrate.

12. A system comprising:
   an alignment sensor, comprising:
      an output to provide radiation from a radiation source onto a target,
      a detector configured to receive radiation from the target, and
      a control system configured to determine alignment of two or more objects responsive to the received radiation; and
   the non-transitory computer program product of claim 9.

13. The system of claim 12, further comprising a lithographic apparatus comprising a support structure configured to hold a patterning device to modulate a radiation beam and a projection optical system arranged to project the modulated radiation beam onto a radiation-sensitive substrate.

14. The non-transitory computer program product of claim 9, wherein the instructions are further configured to, despite a user engaging a particular graphical user interface element, prevent access by the user to the further steps in the measurement design, setup and/or monitoring process for the associated step of the particular graphical user interface element.

15. The non-transitory computer program product of claim 9, wherein the indicator comprises a color of the graphical user interface element and/or a symbol associated with the graphical user interface element.

16. The non-transitory computer program product of claim 9, wherein the instructions are further configured to display a graphical user interface element or indicator that represents, or displays or enables display of information regarding, a key performance indicator and/or a guideline.

17. The non-transitory computer program product of claim 9, wherein the instructions are further configured to use at least three types of indicator, a first displayed indicator indicating that the step in the measurement design, setup and/or monitoring process is not completed and/or that a key performance indicator associated with a step in the measurement design, setup and/or monitoring process has passed a threshold, a second displayed indicator indicating that the step in the measurement design, setup and/or monitoring process is completed and/or that a key performance indicator associated with a step in the measurement design, setup and/or monitoring process has not passed the threshold, and a third displayed indicator indicating that the step in the measurement design, setup and/or monitoring process has not been started.

18. The non-transitory computer program product of claim 9, wherein the instructions are further configured to display an icon, as the indicator, at least partly overlaying the one or more of the plurality of graphical user elements.

19. The non-transitory computer program product of claim 9, wherein the instructions are further configured to display at least one graphical user interface element regarding the physical design of a metrology target, the at least one graphical user interface element enabling access by the user to one or more steps to configure one or more geometric parameters of the metrology target.

20. The non-transitory computer program product of claim 9, wherein the instructions are further configured to have the indicator display, or display upon user flyover, of a value of key performance indicator of the measurement design, setup and/or monitoring process.

* * * * *